(12) United States Patent
Forbes

(10) Patent No.: US 9,893,072 B2
(45) Date of Patent: *Feb. 13, 2018

(54) DRAM WITH NANOFIN TRANSISTORS

(71) Applicant: Micron Technology, Inc., Boise, ID (US)

(72) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 35 days.

This patent is subject to a terminal disclaimer.

(21) Appl. No.: 14/803,954

(22) Filed: Jul. 20, 2015

(65) Prior Publication Data

US 2015/0325579 A1 Nov. 12, 2015

Related U.S. Application Data

(60) Division of application No. 13/357,347, filed on Jan. 24, 2012, now Pat. No. 9,087,730, which is a
(Continued)

(51) Int. Cl.
*H01L 27/108* (2006.01)
*H01L 21/02* (2006.01)
(Continued)

(52) U.S. Cl.
CPC ........ *H01L 27/10876* (2013.01); *B82Y 10/00* (2013.01); *H01L 21/02532* (2013.01);
(Continued)

(58) Field of Classification Search
CPC ........ H01L 27/10826; H01L 27/10879; H01L 2924/13067; H01L 21/823487; H01L 27/11273; H01L 2029/785
See application file for complete search history.

(56) References Cited

U.S. PATENT DOCUMENTS 4,941,026 A 7/1990 Temple
5,013,680 A 5/1991 Lowrey et al.
(Continued)

FOREIGN PATENT DOCUMENTS

CN 101410963 A 4/2009
CN 101410963 B 3/2011
(Continued)

OTHER PUBLICATIONS

"Chinese Application Serial No. 200780011164.2, Office Action dated Oct. 23, 2009 and received Nov. 26, 2009", 5 pgs.
(Continued)

*Primary Examiner* — Davienne Monbleau
*Assistant Examiner* — Leslie Pilar Cruz
(74) *Attorney, Agent, or Firm* — Schwegman Lundberg & Woessner, P.A.

(57) ABSTRACT

One aspect of the present subject matter relates to a memory. A memory embodiment includes a nanofin transistor having a first source/drain region, a second source/drain region above the first source/drain region, and a vertically-oriented channel region between the first and second source/drain regions. The nanofin transistor also has a surrounding gate insulator around the nanofin structure and a surrounding gate surrounding the channel region and separated from the nanofin channel by the surrounding gate insulator. The memory includes a data-bit line connected to the first source/drain region, at least one word line connected to the surrounding gate of the nanofin transistor, and a stacked capacitor above the nanofin transistor and connected between the second source/drain region and a reference potential. Other aspects are provided herein.

20 Claims, 21 Drawing Sheets

Related U.S. Application Data continuation of application No. 12/353,592, filed on Jan. 14, 2009, now Pat. No. 8,119,484, which is a division of application No. 11/397,413, filed on Apr. 4, 2006, now Pat. No. 7,491,995.

(51) Int. Cl.
*B82Y 10/00* (2011.01)
*H01L 21/8234* (2006.01)
*H01L 29/78* (2006.01)

(52) U.S. Cl.
CPC .. *H01L 27/10855* (2013.01); *H01L 27/10879* (2013.01); *H01L 21/823487* (2013.01); *H01L 27/10823* (2013.01); *H01L 27/10826* (2013.01); *H01L 29/785* (2013.01); *H01L 2029/7858* (2013.01); *H01L 2924/13067* (2013.01)

(56) References Cited

U.S. PATENT DOCUMENTS

| | | |
|---|---|---|
| 5,545,586 A | 1/1996 | Koh |
| 5,646,900 A | 7/1997 | Tsukude et al. |
| 5,874,760 A | 2/1999 | Burns, Jr. et al. |
| 5,909,618 A | 6/1999 | Forbes et al. |
| 5,982,162 A | 11/1999 | Yamauchi |
| 5,990,509 A | 11/1999 | Burns, Jr. et al. |
| 6,040,210 A | 3/2000 | Burns, Jr. et al. |
| 6,063,688 A | 5/2000 | Doyle et al. |
| 6,097,065 A | 8/2000 | Forbes et al. |
| 6,104,061 A | 8/2000 | Forbes et al. |
| 6,104,068 A | 8/2000 | Forbes |
| 6,150,687 A | 11/2000 | Noble et al. |
| 6,177,299 B1 | 1/2001 | Hsu et al. |
| 6,191,448 B1 | 2/2001 | Forbes et al. |
| 6,238,976 B1 | 5/2001 | Noble et al. |
| 6,320,222 B1 | 11/2001 | Forbes et al. |
| 6,350,635 B1 | 2/2002 | Noble et al. |
| 6,355,961 B1 | 3/2002 | Forbes |
| 6,376,317 B1 | 4/2002 | Forbes et al. |
| 6,377,070 B1 | 4/2002 | Forbes |
| 6,399,979 B1 | 6/2002 | Noble et al. |
| 6,413,802 B1 | 7/2002 | Hu et al. |
| 6,413,825 B1 | 7/2002 | Forbes |
| 6,414,356 B1 | 7/2002 | Forbes et al. |
| 6,424,001 B1 | 7/2002 | Forbes et al. |
| 6,448,601 B1 | 9/2002 | Forbes et al. |
| 6,492,233 B2 | 12/2002 | Forbes et al. |
| 6,496,034 B2 | 12/2002 | Forbes et al. |
| 6,504,201 B1 | 1/2003 | Noble et al. |
| 6,531,727 B2 | 3/2003 | Forbes et al. |
| 6,559,491 B2 | 5/2003 | Forbes et al. |
| 6,566,682 B2 | 5/2003 | Forbes |
| 6,639,268 B2 | 10/2003 | Forbes et al. |
| 6,649,476 B2 | 11/2003 | Forbes |
| 6,653,174 B1 | 11/2003 | Cho et al. |
| 6,664,806 B2 | 12/2003 | Forbes et al. |
| 6,720,216 B2 | 4/2004 | Forbes |
| 6,747,313 B1 | 6/2004 | Gil |
| 6,762,448 B1 | 7/2004 | Lin et al. |
| 6,801,056 B2 | 10/2004 | Forbes |
| 6,818,937 B2 | 11/2004 | Noble et al. |
| 6,855,582 B1 | 2/2005 | Dakshina-Murthy et al. |
| 6,881,627 B2 | 4/2005 | Forbes et al. |
| 6,890,812 B2 | 5/2005 | Forbes et al. |
| 6,894,532 B2 | 5/2005 | Forbes et al. |
| 6,903,367 B2 | 6/2005 | Forbes |
| 6,946,879 B2 | 9/2005 | Forbes |
| 6,964,903 B2 | 11/2005 | Forbes |
| 7,120,046 B1 | 10/2006 | Forbes |
| 7,326,611 B2 | 2/2008 | Forbes |
| 7,371,627 B1 | 5/2008 | Forbes |
| 7,425,491 B2 | 9/2008 | Forbes et al. |
| 7,439,576 B2 | 10/2008 | Forbes |
| 7,446,372 B2 | 11/2008 | Forbes |
| 7,491,995 B2 | 2/2009 | Forbes |
| 7,547,947 B2 | 6/2009 | Anderson et al. |
| 8,062,949 B2 | 11/2011 | Forbes |
| 8,119,484 B2 * | 2/2012 | Forbes ............... B82Y 10/00 257/E21.629 |
| 8,134,197 B2 | 3/2012 | Forbes |
| 8,354,311 B2 | 1/2013 | Forbes |
| 8,734,583 B2 | 5/2014 | Forbes |
| 8,803,229 B2 | 8/2014 | Forbes |
| 8,823,006 B2 | 9/2014 | Forbes |
| 9,087,730 B2 | 7/2015 | Forbes |
| 2002/0028541 A1 | 3/2002 | Lee et al. |
| 2002/0060338 A1 | 5/2002 | Zhang |
| 2002/0177265 A1 | 11/2002 | Skotnicki |
| 2003/0006410 A1 | 1/2003 | Doyle |
| 2003/0008515 A1 | 1/2003 | Chen et al. |
| 2003/0227072 A1 | 12/2003 | Forbes et al. |
| 2004/0007721 A1 | 1/2004 | Forbes et al. |
| 2004/0108545 A1 | 6/2004 | Ando |
| 2004/0174734 A1 | 9/2004 | Forbes |
| 2004/0217391 A1 | 11/2004 | Forbes |
| 2004/0219722 A1 | 11/2004 | Pham et al. |
| 2004/0235243 A1 | 11/2004 | Noble et al. |
| 2005/0001273 A1 | 1/2005 | Bryant et al. |
| 2005/0023616 A1 | 2/2005 | Forbes |
| 2005/0032297 A1 | 2/2005 | Kamins |
| 2005/0190617 A1 | 9/2005 | Forbes et al. |
| 2006/0043471 A1 | 3/2006 | Tang et al. |
| 2006/0046200 A1 | 3/2006 | Abatchev et al. |
| 2006/0046391 A1 * | 3/2006 | Tang ................ H01L 27/10876 438/268 |
| 2006/0046424 A1 | 3/2006 | Chance et al. |
| 2006/0063350 A1 | 3/2006 | Chance et al. |
| 2006/0076625 A1 | 4/2006 | Lee et al. |
| 2006/0258119 A1 * | 11/2006 | Wells ............... H01L 27/10808 438/424 |
| 2006/0278910 A1 | 12/2006 | Forbes |
| 2007/0018206 A1 | 1/2007 | Forbes |
| 2007/0052012 A1 | 3/2007 | Forbes |
| 2007/0082448 A1 | 4/2007 | Kim et al. |
| 2007/0228433 A1 | 10/2007 | Forbes |
| 2007/0228491 A1 | 10/2007 | Forbes |
| 2007/0231980 A1 | 10/2007 | Forbes |
| 2007/0231985 A1 | 10/2007 | Forbes |
| 2007/0232007 A1 | 10/2007 | Forbes |
| 2008/0315279 A1 | 12/2008 | Forbes |
| 2009/0155966 A1 | 6/2009 | Forbes |
| 2010/0055917 A1 | 3/2010 | Kim |
| 2010/0330759 A1 | 12/2010 | Forbes |
| 2012/0119279 A1 | 5/2012 | Forbes |
| 2012/0168855 A1 | 7/2012 | Forbes |
| 2013/0112982 A1 | 5/2013 | Forbes |
| 2014/0246651 A1 | 9/2014 | Forbes |

FOREIGN PATENT DOCUMENTS

| | | |
|---|---|---|
| CN | 101410961 B | 9/2012 |
| DE | 19943390 A1 | 5/2001 |
| EP | 2002468 B1 | 7/2013 |
| EP | 2002470 B1 | 3/2016 |
| JP | 03218679 A | 9/1991 |
| JP | 05160408 A | 6/1993 |
| JP | 5198817 A | 8/1993 |
| JP | 05198817 A | 8/1993 |
| JP | 06053513 A | 2/1994 |
| JP | 07302914 A | 11/1995 |
| JP | 08032062 A | 2/1996 |
| JP | 10229175 A | 5/1998 |
| JP | 2003124476 A | 4/2003 |
| JP | 2004356314 A | 12/2004 |
| JP | 2004538642 A | 12/2004 |
| JP | 2005039290 A | 2/2005 |
| JP | 2005116969 A | 4/2005 |
| JP | 2005197704 A | 7/2005 |
| JP | 2006511962 A | 4/2006 |
| KR | 9321296 A | 12/1997 |
| KR | 1020000017583 A | 3/2000 |
| KR | 101378256 B1 | 3/2014 |

(56) References Cited

FOREIGN PATENT DOCUMENTS

| SG | 146344 | | 5/2011 |
|---|---|---|---|
| TW | I344181 | | 6/2011 |
| TW | I349970 | B | 10/2011 |
| TW | I357112 | | 1/2012 |
| WO | WO-03015171 | A1 | 2/2003 |
| WO | WO-2004061972 | A1 | 7/2004 |
| WO | WO-2005079182 | A2 | 9/2005 |
| WO | WO-2005079182 | A3 | 9/2005 |
| WO | WO-2007114927 | A1 | 10/2007 |
| WO | WO-2007120492 | A1 | 10/2007 |
| WO | WO-2007120493 | A1 | 10/2007 |
| WO | WO-2007136461 | A2 | 11/2007 |
| WO | WO-2007136461 | A3 | 11/2007 |

OTHER PUBLICATIONS

"Chinese Application Serial No. 200780011084.7, Amendment filed Jan. 16, 2011", (with English translation of amended claims), 13 pgs.

"Chinese Application Serial No. 200780011084.7, Office Action dated Aug. 14, 2009", 8 pgs.

"Chinese Application Serial No. 200780011084.7, Office Action dated Sep. 26, 2010", 5 pgs.

"Chinese Application Serial No. 200780011084.7, Office Action dated Sep. 15, 2011", 10 pgs.

"Chinese Application Serial No. 200780011084.7, Response filed Nov. 30, 2011 to Office Action dated Sep. 15, 2011", 8 pgs.

"Chinese Application Serial No. 200780011164.2, Amendment filed Jan. 17, 2010", (with English translation of amended claims), 16 pgs.

"Chinese Application Serial No. 200780011164.2, Office Action dated Mar. 10, 2010", 8 pgs.

"Chinese Application Serial No. 200780012174.8, Office Action dated Feb. 14, 2012", w/ English Translation, 8 pgs.

"Chinese Application Serial No. 200780012174.8, Office Action dated Mar. 1, 2010", with English translation, 8 pgs.

"Chinese Application Serial No. 200780012174.8, Office Action dated Mar. 30, 2011", 4 pgs.

"Chinese Application Serial No. 200780012174.8, Office Action datd Jul. 17, 2012", 4 pgs.

"Chinese Application Serial No. 200780012174.8, Office Action dated Dec. 3, 2010", with English translation, 5 pgs.

"Chinese Application Serial No. 200780012174.8, Office Action dated Jun. 5, 2012", 4 pgs.

"Chinese Application Serial No. 200780012174.8, Office Action response filed Jan. 28, 2011", (with English translation of amended claims), 12 pgs.

"Chinese Application Serial No. 200780012174.8, Response filed Apr. 26, 2012 to Office Action dated Feb. 14, 2012", 16 pgs.

"Chinese Application Serial No. 200780012174.8, Response filed Aug. 16, 2012 to Office Action dated Jul. 17, 2012", 14 pgs.

"Chinese Application Serial No. 200780012174.8, Response filed Feb. 10, 2011", (with English translation of amended claims), 13 pgs.

"European Application Serial No. 07754621.6, Examination Notification Art. 94(3) dated Feb. 4, 2011", 5 Pgs.

"European Application Serial No. 07754621.6, Response filed May 16, 2011 to Examination Notification Art. 94(3) dated Feb. 4, 2011", 7 pgs.

"European Application Serial No. 07754850.1, Office Action dated May 25, 2010", 6 pgs.

"European Application Serial No. 07754850.1, Office Action dated Jun. 9, 2011", 5 pgs.

"European Application Serial No. 07754850.1, Office Action Response dated Nov. 17, 2010", 19 pgs.

"European Application Serial No. 07754850.1, Response filed Oct. 17, 2011 to Office Action dated Jun. 9, 2011", 13 pgs.

"European Application Serial No. 07809002.4 Response filed Nov. 28, 2014 to Examination Notification dated Jul. 23, 2014", With the amended claims, 11 pgs.

"European Application Serial No. 07809002.4, Examination Notification Art. 94(3) dated Feb. 4, 2011", 5 pgs.

"European Application Serial No. 07809002.4, Examination Notification Art. 94(3) dated Mar. 10, 2015", 4 pgs.

"European Application Serial No. 07809002.4, Examination Notification Art. 94(3) dated Jul. 23, 2014", 5 pgs.

"European Application Serial No. 07809002.4, Office Action dated Feb. 20, 2013", 7 pgs.

"European Application Serial No. 07809002.4, Response filed May 23, 2011 to Examination Notification Art. 94(3) dated Feb. 4, 2011", 11 pgs.

"European Application Serial No. 07809002.4, Response filed Jul. 1, 2013 to Examination Notification Art. 94(3) dated Feb. 20, 2013", 14 pgs.

"International Application No. PCT/US2007/008084, Search Report dated Jul. 11, 2007", 4 pgs.

"International Application No. PCT/US2007/008084, Written Opinion dated Jul. 11, 2007", 5 pgs.

"International Application Serial No. PCT/US2007008400, International Preliminary Report on Patentability dated Oct. 16, 2008", 8 pgs.

"International Application Serial No. PCT/US2007008400, International Search Report dated Sep. 18, 2007", 4 pgs.

"International Application Serial No. PCT/US2007008400, Written Opinion dated Sep. 18, 2007", 6 pgs.

"International Search Report and Written Opinion dated Aug. 21, 2007 in International Application No. PCT/US2007/008123", 11 pgs.

"International Search Report and Written Opinion dated Aug. 21, 2007 in Application Serial No. PCT/US2007/008124", 11 pgs.

"Japanese Application Serial No. 2009-504232, Amendment filed Mar. 31, 2010", (with English translation of amended claims), 16 pgs.

"Japanese Application Serial No. 2009-504232, Office Action dated Oct. 9, 2012", With English Translation, 14 pgs.

"Japanese Application Serial No. 2009-504232, Response filed Jan. 9, 2013 to Office Action dated Oct. 9, 2012", 16 pgs.

"Japanese Application Serial No. 2009-504238, Office Action dated Oct. 9, 2012", With English Translation, 16 pgs.

"Japanese Application Serial No. 2009-504238, Response filed Jan. 8, 2013 to Office Action dated Oct. 9, 2012", 18 pgs.

"Japanese Application Serial No. 2009-504238, Voluntary Amendment filed Mar. 24, 2010", (with English translation of amended claims), 17 pgs.

"Japanese Application Serial No. 2009-504280, Amendment filed Mar. 31, 2010", with English translation, 15 pgs.

"Japanese Application Serial No. 2009-504280, Office Action dated Oct. 9, 2012", With English Translation, 6 pgs.

"Japanese Application Serial No. 2009-504280, Response filed Dec. 18, 2012 to Office Action dated Oct. 9, 2012", 13 pgs.

"Korean Application Serial No. 10-2008-7026973, Notice of Appeal filed Sep. 18, 2014", 21 pgs.

"Korean Application Serial No. 10-2008-7026973, Notice of Final Rejection dated Jul. 30, 2014", 6 pgs.

"Korean Application Serial No. 10-2008-7026973, Office Action dated Dec. 28, 2013", 10 pgs.

"Korean Application Serial No. 10-2008-7026973, Preliminary Rejection dated Jun. 25, 2013", 7 pgs.

"Korean Application Serial No. 10-2008-7026973, Response filed Feb. 28, 2014 to Office Action dated Dec. 28, 2013", 21 pgs.

"Korean Application Serial No. 10-2008-7026973, Response filed Aug. 26, 2013 to Office Action dated Jun. 25, 2013", 29 pgs.

"Korean Application Serial No. 10-2008-7026973, Voluntary Amendment filed Mar. 20, 2012", Without English Translation, 2 pgs.

"Korean Application Serial No. 10-2008-7027075, Amendment filed Apr. 9, 2014", 23 pgs.

"Korean Application Serial No. 10-2008-7027075, Appeal Brief filed Apr. 11, 2014", 14 pgs.

(56) References Cited

OTHER PUBLICATIONS

"Korean Application Serial No. 10-2008-7027075, Notice of Final Rejection dated Dec. 10, 2013", 6 pgs.

"Korean Application Serial No. 10-2008-7027075, Office Action dated Apr. 22, 2014", 3 pgs.

"Korean Application Serial No. 10-2008-7027075, Office Action dated May 16, 2013", 6 pgs.

"Korean Application Serial No. 10-2008-7027075, Response filed Jul. 31, 2013 to Office Action dated May 16, 2013", 20 pgs.

"Korean Application Serial No. 10-2008-7027077, Notice of Appeal filed Jan. 8, 2014", 5 pgs.

"Korean Application Serial No. 10-2008-7027077, Notice of Final Rejection dated Dec. 10, 2013", 3 pgs.

"Korean Application Serial No. 10-2008-7027077, Notice of Preliminary Rejection dated Jun. 7, 2013", 12 pgs.

"Korean Application Serial No. 10-2008-7027077, Response filed Aug. 7, 2013 to Office Action dated Jun. 7, 2013", 17 pgs.

"Korean Application Serial No. 10-2008-7027077, Voluntary Amendment filed Apr. 2, 2012", 14 pgs.

"Korean Application Serial No. 10-2014-7009477, Notice of Preliminary Rejection dated Jun. 11, 2014", 3 pgs.

"Photolithography", [Online]. Retrieved from the Internet: <URL: http://web.archive.org/web/20020211230307/http://britneyspears.aclphysics/fabrication/photolithography.htm>, (Feb. 11, 2002), 3 pgs.

"Taiwan Application Serial No. 96112124, Notice of Allowance dated Jul. 13, 2011", 2.

"Taiwanese Application Serial No. 096112121, Office Action dated Dec. 24, 2010", English translation, 7 pgs.

"Taiwanese Application Serial No. 096112121, Office Action dated Apr. 7, 2011", Notification letter, 2 pgs.

"Taiwanese Application Serial No. 96112122, Notice of Allowance dated Mar. 8, 2011", 2 pgs.

"Taiwanese Application Serial No. 96112122, Office Action dated Sep. 17, 2010", 6 pgs.

"Taiwanese Application Serial No. 96112122, Office Action Response filed Jan. 6, 2011", with English translation of claims and abstract, 36 pgs.

"Taiwanese Application Serial No. 96112125, Office Action dated Dec. 2, 2010", with English translation of claims, 15 pgs.

"Taiwanese Application Serial No. 96112125, Response filed Jun. 6, 2011 to Office Action dated Dec. 2, 2010", 33 pgs.

Adler, E., et al., "The Evolution of IBM CMOS DRAM Technology", IBM Journal of Research & Development, 39(1-2), (Jan.-Mar. 1995), 167-188.

Bryllert, Tomas, et al., "Vertical high mobility wrap-gated InAs nanowire transistor", IEEE Device Research Conference, Santa Barbara, CA, (Jun. 2005), 157-158.

Cho, Hyun-Jin, et al., "A Novel Pillar DRAM Cell for 4Gbit and Beyond", 1998 Symposium on VLSI Technology Digest of Technical Papers, Jun. 9-11, 1998, (Jun. 1998), 38-39.

Denton, Jack P., et al., "Fully depleted dual-gated thin-film SOI P-MOSFETs fabricated in SOI islands with an isolated buried polysilicon backgate", IEEE Electron Device Letters, 17(11), (Nov. 1996), 509-511.

Doyle, B. S., et al., "High performance fully-depleted tri-gate CMOS transistors", IEEE Electron Device Letters, vol. 24, No. 4, (Apr. 2003), 263-265.

Doyle, B. S., et al., "Tri-Gate fully-depleted CMIS transistors: fabrication, design and layout", 2003 Symposium on VLSI Technology Digest of Technical Papers, Kyoto, Japan, Jun. 10-12, 2003, (2003), 133-134.

Forbes, Leonard, "DRAM Arrays, Vertical Transistor Structures, and Methods of Forming Transistor Structures and DRAM Arrays", U.S. Appl. No. 11/051,119, filed Feb. 3, 2005, 52 pages.

Forbes, Leonard, "DRAM Tunneling Access Transistor", U.S. Appl. No. 11/219,085, filed Aug. 29, 2005, 31 pages.

Forbes, Leonard, "DRAM With Nanofin Transistors", U.S. Appl. No. 11/397,413, filed Apr. 4, 2006, 48 pgs.

Forbes, Leonard, "Etched Nanofin Transistors", U.S. Appl. No. 11/397,358, filed Apr. 4, 2006, 37 pgs.

Forbes, Leonard, "Grown Nanofin Transistors", U.S. Appl. No. 11/397,430, filed Apr. 4, 2006, 37 pgs.

Forbes, Leonard, "Memory Array With Surrounding Gate Access Transistors and Capacitors With Global and Staggered Local Bit Lines", U.S. Appl. No. 11/128,585, filed May 13, 2005, 42 pages.

Forbes, Leonard, "Memory Array With Ultra-Thin Etched Pillar Surround Gate Access Transistors and Buried Data/Bit Lines", U.S. Appl. No. 11/129,502, filed May 13, 2005, 33 pages.

Forbes, Leonard, "Nanowire Transistor With Surrounding Gate", U.S. Appl. No. 11/397,430, filed Apr. 4, 2006, 37 pgs.

Forbes, Leonard, "Surround Gate Access Transistors With Grown Ultra-Thin Bodies", U.S. Appl. No. 11/175,677, filed Jul. 6, 2005, 28 pages.

Forbes, Leonard, "Tunneling Transistor With Sublithographic Channel", U.S. Appl. No. 11/397,406, filed Apr. 4, 2006, 63 pgs.

Forbes, Leonard, "Ultra-Thin Body Vertical Tunneling Transistor", U.S. Appl. No. 11/215,468, filed Aug. 29, 2005, 27 pages.

Forbes, Leonard, "Vertical Transistor, Memory Cell, Device, System and Method of Forming Same", U.S. Appl. No. 11/151,219, filed Jun. 13, 2005, 39 pages.

Forbes, Leonard, "Vertical Tunneling Nano-Wire Transistor", U.S. Appl. No. 11/210,374, filed Aug. 24, 2005, 26 pages.

Huang, Xuejue, et al., "Sub-50 nm P-Channel FinFET", IEEE Transactions on Electron Devices, vol. 48, No. 5, (May 2001), 880-886.

Kalavade, Pranav, et al., "A novel sub-10 nm transistor", 58th DRC. Device Research Conference. Conference Digest, (Jun. 19-21, 2000), 71-72.

Kedzierski, Jakub, et al., "Threshold voltage control in NiSi-gated MOSFETs through silicidation induced impurity segregation (SIIS)", IEDM Tech. Dig., (2003), 315-318.

Kim, Keunwoo, et al., "Nanoscale CMOS Circuit Leakage Power Reduction by Double-Gate Device", International Symposium on Low Power Electronics and Design, Newport, CA, Aug. 9-11, 2004; http://www.islped.org, (2004), 102-107.

Lee, Choonsup, et al., "A Nanochannel Fabrication Technique without Nanolithography", Nano Letters, vol. 3, No. 10, (2003), 1339-1340.

Mitsutoshi, et al., "Excimer laser annealing of amorphous and solid-phase-crystallized silicon films.", Journal of Applied Physics, vol. 86, No. 10, (Nov. 15, 1999.), 10 pgs.

Miyano, Shinji, et al., "Numerical Analysis of a Cylindrical Thin-Pillar Transistor (CYNTHIA)", IEEE Transactions on Electron Devices, vol. 39, No. 8, (Aug. 1992), 1876-1881.

Nirschl, TH., et al., "The Tunneling Field Effect Transistor (TFET) as an Add-on for Ultra-Low-Voltage Analog and Digital Processes", IEEE International Electron Devices Meeting, 2004; IEDM Technical Digest, (Dec. 13-15, 2004), 195-198.

Rahman, Anisur, et al., "Theory of Ballistic Nanotransistors", IEEE Transactions on Electron Devices, vol. 50, No. 9, (Sep. 2003), 1853-1864.

Samuelson, L., et al., "Semiconductor nanowires for 0D and 1D physics and applications", Physica E 25, (Jul. 27, 2004), 313-318.

Samuelson, Lars, "Semiconductor Nanowires as a Novel Electronic Materials Technology for Future Electronic Devices", IEEE Device Research Conference, Santa Barbara, CA, (Jun. 2005), 245.

Shimomura, K., et al., "A 1-V 46-ns 16-Mb SOI-DRAM with body control technique", IEEE Journal of Solid-State Circuits, 32(11), (Nov. 1997), 1712-1720.

Shimomura, K., et al., "A 1V 46ns 16Mb SOI-DRAM with Body Control Technique", 1997 IEEE International Solid-State Circuits Conference, Digest of Technical Papers, (Feb. 6, 1997), 68-69.

Takato, H., et al., "High Performance CMOS Surrounding Gate Transistor (SGT) for Ultra High Density LSIs", IEEE International Electron Devices Meeting, Technical Digest, (1988), 222-225.

Wong, Hon-Sum Philip, et al., "Self-Aligned (Top and Bottom) Double-Gate MOSFET with a 25 nm Thick Silicon Channel", IEEE Int. Electron Device Meeting, (1997), 427-430.

Xuan, Peiqi, et al., "60nm Planarized Ultra-thin Body Solid Phase Epitaxy MOSFETs", IEEE Device Research Conference, Conference Digest. 58th DRC, (Jun. 19-21, 2000), 67-68.

(56) References Cited

OTHER PUBLICATIONS

Ziegler, James F., et al., "Cosmic Ray Soft Error Rates of 16-Mb DRAM Memory Chips", IEEE Journal of Solid-State Circuits, vol. 33, No. 2, (Feb. 1998), 246-252.
"U.S. Appl. No. 11/397,358, 312 Amendment filed Nov. 19, 2012", 3 pgs.
"U.S. Appl. No. 11/397,358, Response filed Feb. 19, 2010 to Advisory Action dated Jan. 15, 2010", 10 pgs.
"Chinese Application Serial No. 200780011084.7, Response filed Jan. 17, 2011 Office Action dated Sep. 26, 2010", W/ English Claims, 13 pgs.
"Chinese Application Serial No. 200780011084.7, Response filed Dec. 11, 2009 to Office Action dated Aug. 14, 2009", W/ English Claims, 17 pgs.
"Chinese Application Serial No. 200780011164.2, Response filed Jun. 11, 2010 to Office Action dated Mar. 10, 2010", W/ English Claims, 16 pgs.
"Chinese Application Serial No. 200780012174.8, Response filed Jun. 1, 2011 to Office Action dated Mar. 30, 2011", W/ English Claims, 16 pgs.
"Chinese Application Serial No. 200780012174.8, Response filed Jun. 13, 2010 to Office Action dated Mar. 1, 2010", W/ English Claims, 11 pgs.
"European Application Serial No. 07809002.4, Response filed Jul. 16, 2015 to Examination Notification Art 94(3) dated Mar. 10, 2015", 9 pgs.
"International Application No. PCT/US2007/008084, International Preliminary Report on Patentability dated Oct. 8, 2008", 7 pgs.
"International Application Serial No. PCT/US2007/008123, International Preliminary Report on Patentability dated Oct. 8, 2008", 8 pgs.
"International Application Serial No. PCT/US2007/008123, International Search Report dated Aug. 21, 2007", 3 pgs.
"International Application Serial No. PCT/US2007/008123, Written Opinion dated Aug. 21, 2007", 6 pgs.
"International Application Serial No. PCT/US2007/008124, International Preliminary Report on Patentability dated Oct. 8, 2008", 6 pgs.
"International Application Serial No. PCT/US2007/008124, International Search Report dated Aug. 21, 2007", 3 pgs.
"International Application Serial No. PCT/US2007/008124, Written Opinion dated Aug. 21, 2007", 6 pgs.
"Singaporean Application Serial No. 201103872-6, Preliminary Amendment filed Nov. 27, 2014", W/ English Translation, 16 pgs.
U.S. Appl. No. 11/397,527, filed Apr. 4, 2006, Nanowire Transistor With Surrounding Gate, Now U.S. Pat. No. 7,425,491.
U.S. Appl. No. 12/192,618, filed Aug. 15, 2008, Nanowire Transistor With Surrounding Gate, Now U.S. Pat. No. 8,134,197.
U.S. Appl. No. 12/198,265, filed Aug. 26, 2008, Nanowire Transistor With Surrounding Gate, Now U.S. Pat. No. 8,062,949.
U.S. Appl. No. 13/417,809, filed Mar. 12, 2012, Nanowire Transistor With Surrounding Gate, Now U.S. Pat. No. 8,803,229.
U.S. Appl. No. 11/397,430, filed Apr. 4, 2006, Grown Nanofin Transistors, Now U.S. Pat. No. 8,734,583.
U.S. Appl. No. 14/276,473, filed May 13, 2014, Grown Nanofin Transistors.
U.S. Appl. No. 11/397,358, filed Apr. 4, 2006, Method for Forming Nanofin Transistors, Now U.S. Pat. No. 8,354,311.
U.S. Appl. No. 13/723,838, filed Dec. 21, 2012, Nanofin Transistors With Crystalline Semiconductor Fins, Now U.S. Pat. No. 8,823,006.
U.S. Appl. No. 11/397,413, filed Apr. 4, 2006, DRAM With Nanofin Transistors, Now U.S. Pat. No. 7,491,995.
U.S. Appl. No. 12/353,592, filed Jan. 14, 2009, DRAM With Nanofin Transistors, Now U.S. Pat. No. 8,119,484.
U.S. Appl. No. 13/357,347, filed Jan. 24, 2012, DRAM With Nanofin Transistors, Now U.S. Pat. No. 9,087,730.
U.S. Appl. No. 11/397,406, filed Apr. 4, 2006, Tunneling Transistors With Sublithographic Channel.

\* cited by examiner

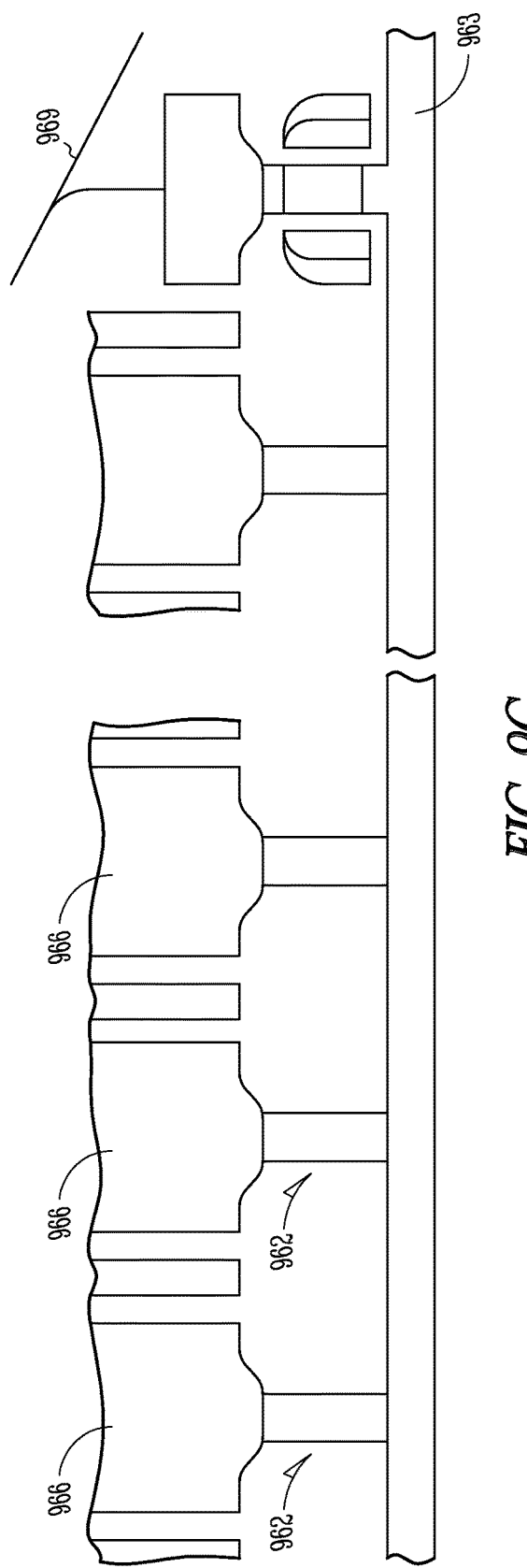

DRAM WITH NANOFIN TRANSISTORS

CROSS REFERENCE TO RELATED APPLICATIONS

This application is a divisional of U.S. application Ser. No. 13/357,347, filed Jan. 24, 2012, now issued as U.S. Pat. No. 9,087,730, which is a continuation of U.S. application Ser. No. 12/353,592, filed Jan. 14, 2009, now issued as U.S. Pat. No. 8,119,484, which is a divisional of U.S. application Ser. No. 11/397,413, filed Apr. 4, 2006, now issued as U.S. Pat. No. 7,491,995, all of which are incorporated herein by reference in their entirety.

This application is related to the following commonly assigned U.S. patent applications which are herein incorporated by reference in their entirety: "Nanowire Transistor With Surrounding Gate," U.S. application Ser. No. 11/397,527, filed on Apr. 4, 2006 (U.S. Pub. 20070232007); "Grown Nanofin Transistors," U.S. application Ser. No. 11/397,430, filed on Apr. 4, 2006 (U.S. Pub. 20070231985); "Etched Nanofin Transistors," U.S. application Ser. No. 11/397,358, filed on Apr. 4, 2006 (U.S. Pub. 20070231980); and "Tunneling Transistor With Sublithographic Channel," U.S. application Ser. No. 11/397,406, filed on Apr. 4, 2006 (U.S. Pub. 20070228491).

TECHNICAL FIELD

This disclosure relates generally to semiconductor devices, and more particularly, to DRAMs with nanofin transistors.

BACKGROUND

The semiconductor industry has a market driven need to reduce the size of devices, such as transistors, and increase the device density on a substrate. Some product goals include lower power consumption, higher performance, and smaller sizes. FIG. 1 illustrates general trends and relationships for a variety of device parameters with scaling by a factor k. The continuous scaling of MOSFET technology to the deep sub-micron region where channel lengths are less than 0.1 micron (100 nm or 1000 Å) causes significant problems in the conventional transistor structures. For example, junction depths should be much less than the channel length. Thus, with reference to the transistor 100 illustrated in FIG. 1, the junctions depths 101 should be on the order of a few hundred Angstroms for channels lengths 102 that are approximately 1000 Å long. Such shallow junctions are difficult to form by conventional implantation and diffusion techniques. Extremely high levels of channel doping are required to suppress short-channel effects such as drain induced barrier lowering, threshold voltage roll off, and sub-threshold conduction. Sub-threshold conduction is particularly problematic in DRAM technology as it reduces the charge storage retention time on the capacitor cells. These extremely high doping levels result in increased leakage and reduced carrier mobility. Thus, the expected improved performance attributed to a shorter channel is negated by the lower carrier mobility and higher leakage attributed to the higher doping.

Leakage current is a significant issue in low voltage and lower power battery-operated CMOS circuits and systems, and particularly in DRAM circuits. The threshold voltage magnitudes are small to achieve significant overdrive and reasonable switching speeds. However, as illustrated in FIG. 2, the small threshold results in a relatively large sub-threshold leakage current.

Some proposed designs to address this problem use transistors with ultra-thin bodies, or transistors where the surface space charge region scales as other transistor dimensions scale down. Dual-gated or double-gated transistor structures also have been proposed to scale down transistors. As commonly used in the industry, "dual-gate" refers to a transistor with a front gate and a back gate which can be driven with separate and independent voltages, and "double-gated" refers to structures where both gates are driven when the same potential. An example of a double-gated device structure is the FinFET. "TriGate" structures and surrounding gate structures have also been proposed. In the "TriGate" structure, the gate is on three sides of the channel. In the surrounding gate structure, the gate surrounds or encircles the transistor channel. The surrounding gate structure provides desirable control over the transistor channel, but the structure has been difficult to realize in practice.

FIG. 3 illustrates a dual-gated MOSFET with a drain, a source, and front and back gates separated from a semiconductor body by gate insulators, and also illustrates an electric field generated by the drain. Some characteristics of the dual-gated and/or double-gated MOSFET are better than the conventional bulk silicon MOSFETs, because compared to a single gate, the two gates better screen the electric field generated by the drain electrode from the source-end of the channel. The surrounding gate further screens the electric field generated by the drain electrode from the source. Thus, sub-threshold leakage current characteristics are improved, because the sub-threshold current is reduced more quickly as the gate voltage is reduced when the dual-gate and/or double gate MOSFET turns off. FIG. 4 generally illustrates the improved sub-threshold characteristics of dual gate, double-gate, or surrounding gate MOSFETs in comparison to the sub-threshold characteristics of conventional bulk silicon MOSFETs.

FIGS. 5A-C illustrate a conventional FinFET. FIG. 5A illustrates a top view of the FinFET and FIG. 5B illustrates an end view of the FinFET along line 5B-5B. The illustrated FinFET 503 includes a first source/drain region 504, a second source drain region 505, a silicon fin 506 extending between the first and second source/drain regions. The silicon fin functions as a transistor body, where the channel between the first and second source/drain regions is horizontal. A gate insulator 507, such as silicon oxide, is formed over the fin, and a gate 508 is formed over the fin after the oxide is formed thereon. The fin of the illustrated conventional FinFET is formed over buried oxide 509. FIG. 5C illustrates a conventional etch technique for fabricating the fin for the FINFET. As illustrated in FIG. 5C, the fin width is defined by photolithography or e-beam lithography and etch. Thus, the fin width is initially a minimum feature size (1F). The width of the fin is subsequently reduced by oxidation or etch, as illustrated by arrows 510.

SUMMARY

Aspects of the present subject matter provide nanofin transistors with near ideal sub-threshold characteristics and miniaturized sub-threshold leakage, and with extremely small drain region volumes to minimize drain leakage currents. One method for fabricating the nanofins involves growing the nanofins on a substrate, using solid phase epitaxial growth to recrystallize amorphous semiconductor on the substrate. Another method for fabricating the nanofins involves etching fins into single crystalline silicon substrates. The silicon nanofins are formed with dimensions smaller than lithographic dimensions by sidewall spacer techniques. The present subject matter applies these transistors in DRAM arrays as access transistors to improve DRAM retention time. The ultrathin fin shaped bodies of the fin transistors reduce sub-threshold leakage and the extremely small drain regions and surface areas reduce junction leakage. Some embodiments, for example, provide ultrathin fins within a range of thicknesses on the order of 20 nm to 50 nm.

One aspect of the present subject matter relates to a memory. A memory embodiment includes a nanofin transistor having a first source/drain region, a second source/drain region above the first source/drain region, and a vertically-oriented channel region between the first and second source/drain regions. The nanofin transistor also has a surrounding gate insulator around the nanofin structure and a surrounding gate surrounding the channel region and separated from the nanofin channel by the surrounding gate insulator. The memory includes a data-bit line connected to the first source/drain region, at least one word line connected to the surrounding gate of the nanofin transistor, and a stacked capacitor above the nanofin transistor and connected between the second source/drain region and a reference potential.

These and other aspects, embodiments, advantages, and features will become apparent from the following description of the present subject matter and the referenced drawings.

BRIEF DESCRIPTION OF THE DRAWINGS

FIGS. 9A-9C illustrate the application of FINFETs as DRAM access transistors with buried data-bit lines, according to various embodiments of the present subject matter.

DETAILED DESCRIPTION

Figure 1:
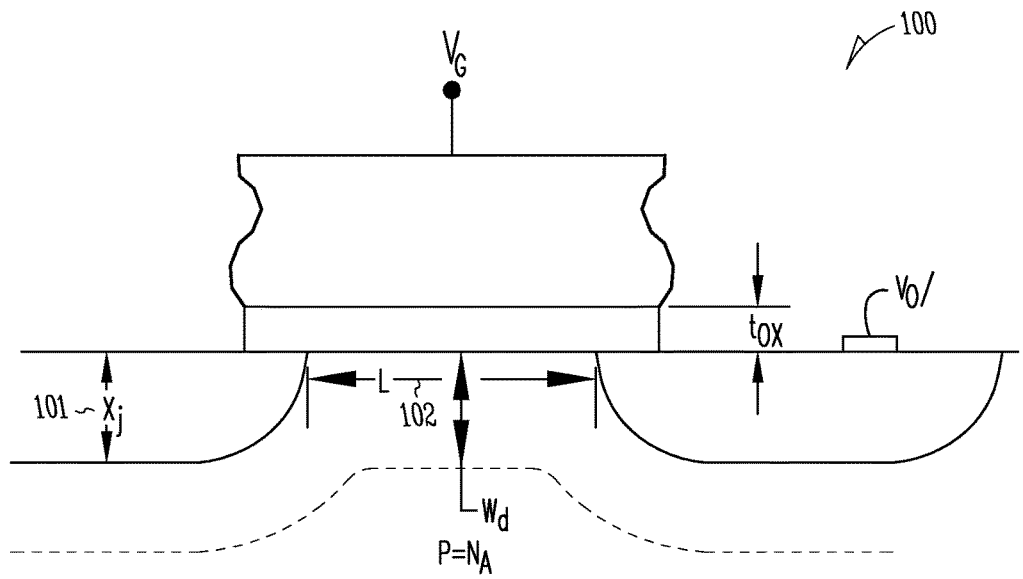
FIG. 1 illustrates general trends and relationships for a variety of device parameters with scaling by a factor k.
Figure 2:
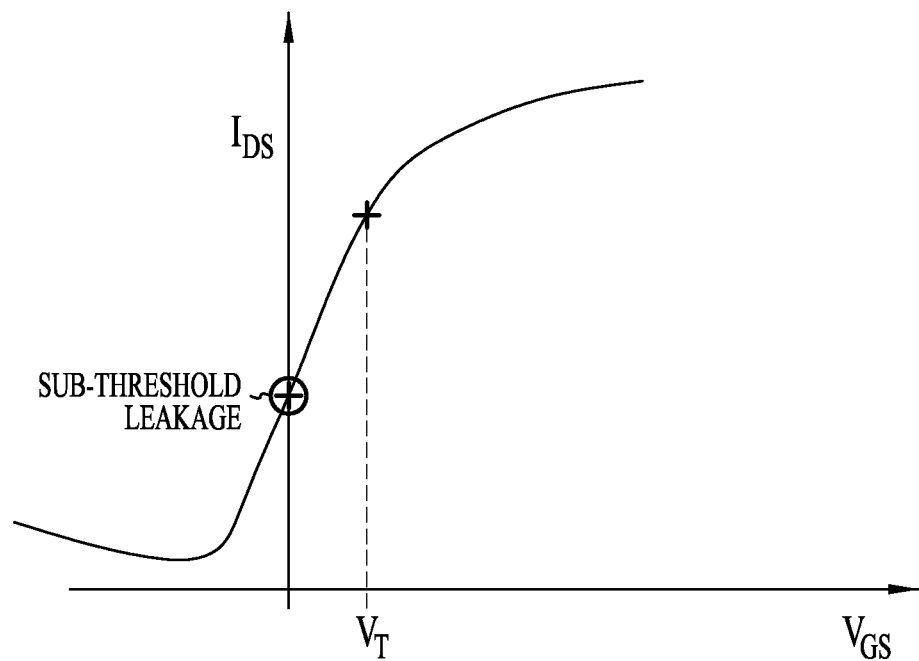
FIG. 2 illustrates sub-threshold leakage in a conventional silicon MOSFET.
Figure 3:
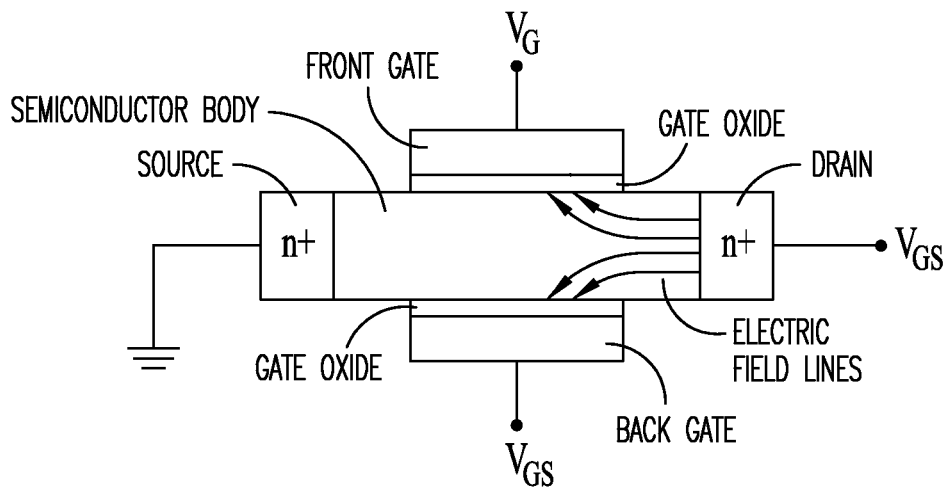
FIG. 3 illustrates a dual-gated MOSFET with a drain, a source, front and back gates separated from a semiconductor body by gate insulators, and an electric field generated by the drain.
Figure 4:
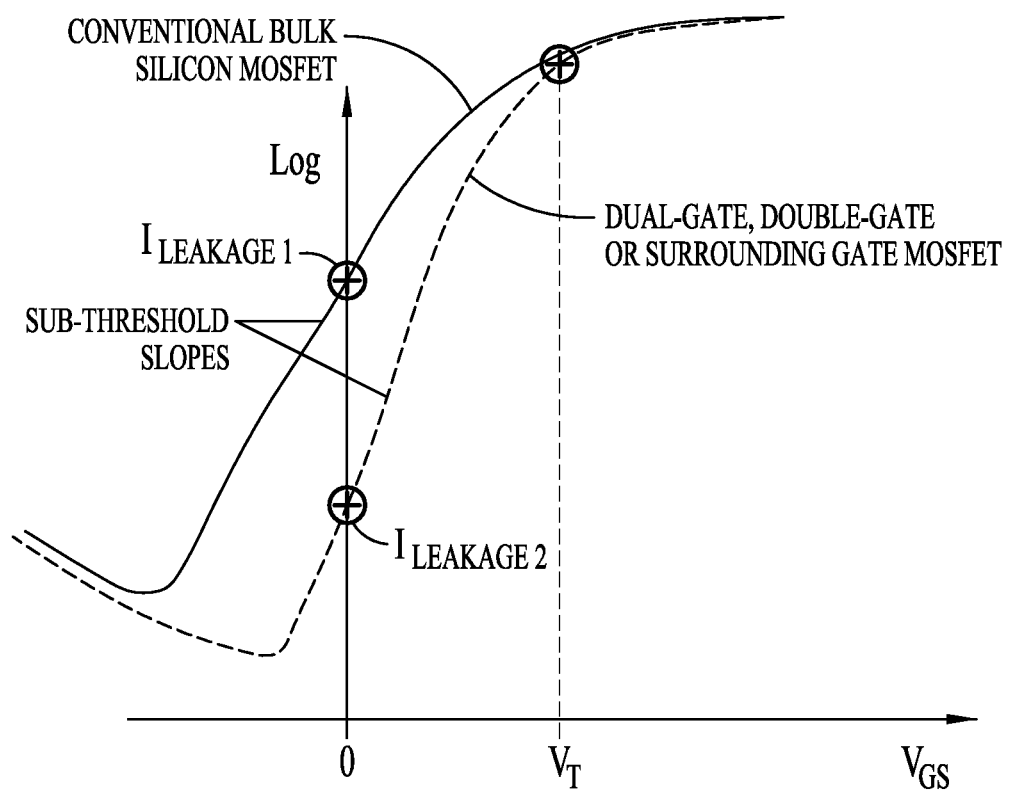
FIG. 4 generally illustrates the improved sub-threshold characteristics of dual gate, double-gate, and surrounding gate MOSFETs in comparison to the sub-threshold characteristics of conventional bulk silicon MOSFETs.
Figure 5A:
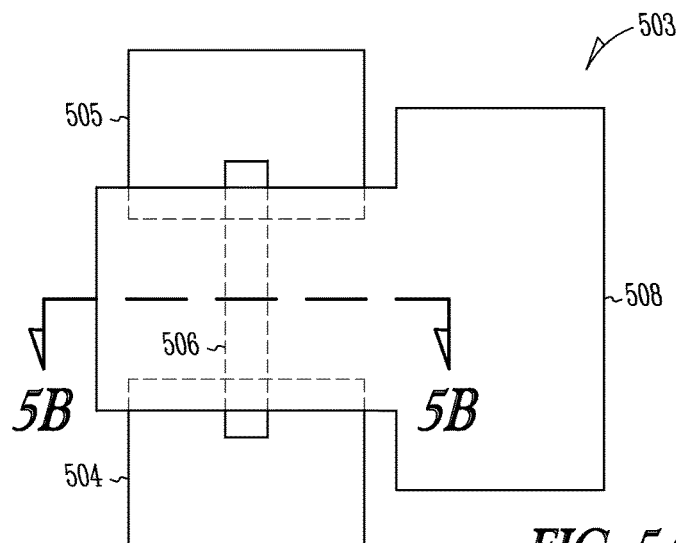
FIGS. 5A-C illustrate a conventional FINFET.
Figure 5B:
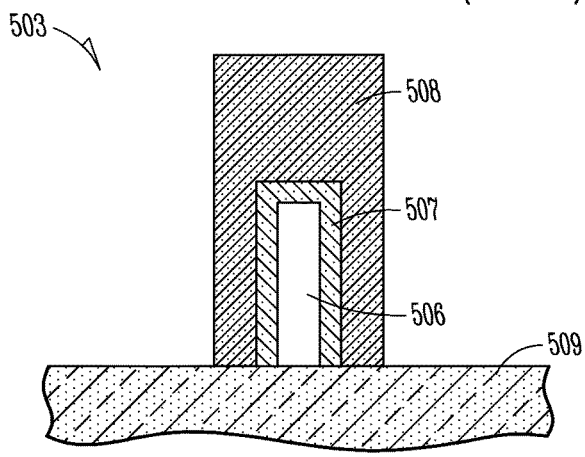
Figure 5C:
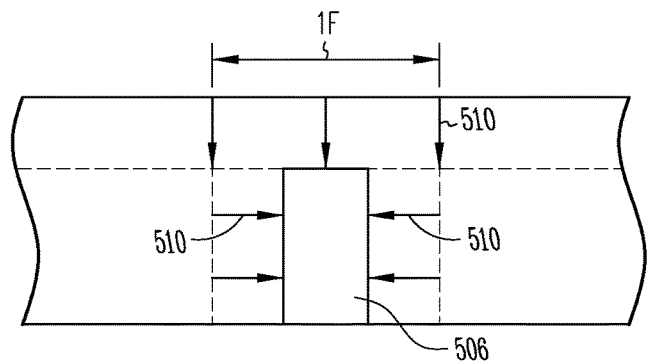

The following detailed description refers to the accompanying drawings which show, by way of illustration, specific aspects and embodiments in which the present subject matter may be practiced. These embodiments are described in sufficient detail to enable those skilled in the art to practice the present subject matter. The various embodiments of the present subject matter are not necessarily mutually exclusive as aspects of one embodiment can be combined with aspects of another embodiment. Other embodiments may be utilised and structural, logical, and electrical changes may be made without departing from the scope of the present subject matter. In the following description, the terms "wafer" and "substrate" are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Aspects of the present subject matter provide nanofin transistors with vertical channels, where there is a first source/drain region at the bottom of the fin and a second source/drain region at the top of the fin, and use these nanofin transistors in a DRAM device. The nanofins can be formed using a technique that recrystallizes vertical amorphous nanofins on a substrate as described in U.S. patent application Ser. No. 11/397,430, filed on Apr. 4, 2006 (U.S. Pub. 20070231985) and a technique that etches single crystalline nanofins as described in U.S. patent application Ser. No. 11/397,358, filed on Apr. 4, 2006 (U.S. Pub. 20070231980). Access transistors for DRAM arrays use these nanofin transistors to control sub-threshold leakage and improve DRAM retention time. The ultrathin fin shaped bodies of the transistors reduce sub-threshold leakage and the extremely small drain regions and surface areas reduce junction leakage.

Dual-gated, double-gated, and/or surrounding gate MOSFETs offer better characteristics than conventional bulk silicon MOSFETs. Whereas conventional MOSFETs have a gate only on one side of the channel, the dual-gated or double-gated MOSFETs provide a gate electrode on both sides of the channel, and the surrounding gate MOSFETs provide a gate that surrounds the channel. When there are two gates or surrounding gates, the electric field generated by the drain electrode is better screened from the source-end of the channel. This results in an improved sub-threshold leakage current characteristic and the MOSFET turns off and the sub-threshold current is reduced more quickly as the gate voltage is reduced. These transistors with thin bodies then serve to improve the sub-threshold characteristics and control sub-threshold leakage.

Nanofin Transistors and Methods of Formation

Figure 6A:
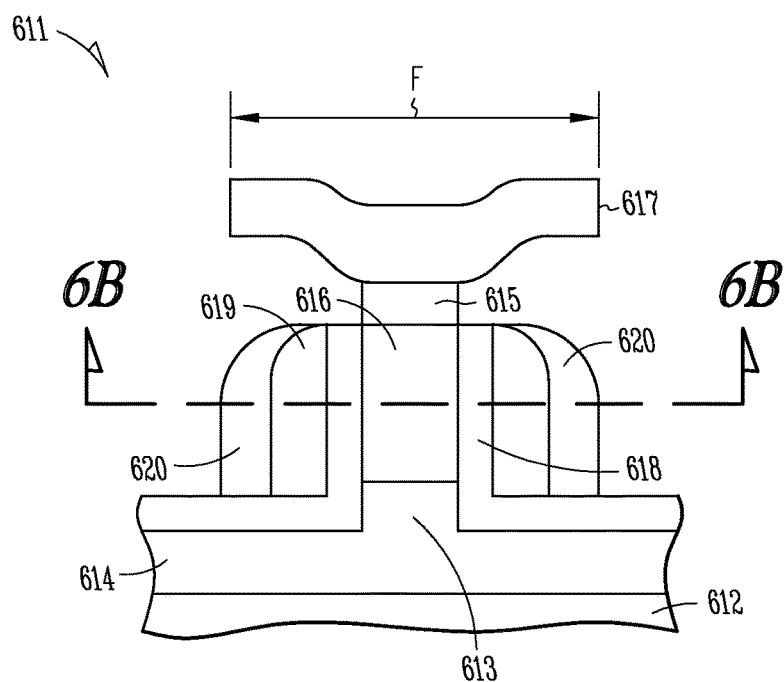
FIGS. 6A-6B illustrate a side view and a cross-section view of along line 6B-6B, respectively, of a vertically-oriented nanofin transistor, according to various embodiments of the present subject matter.
Figure 6B:
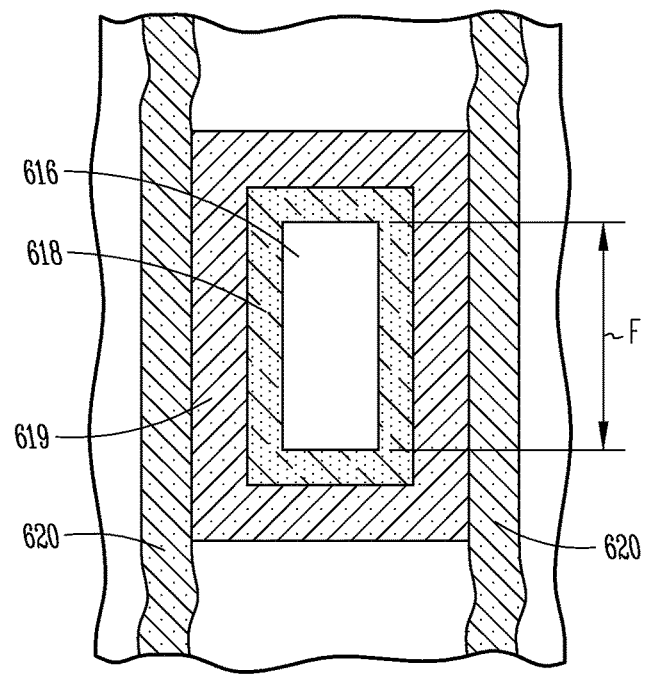

FIGS. 6A-6B illustrate a side view and a cross-section view of along line 6B-6B, respectively, of a vertically-oriented nanofin transistor 611, according to various embodiments of the present subject matter. In the illustrated nanofin transistor, the vertically-oriented nanofin transistor is positioned over a doped region in a substrate 612 that forms a first source/drain region 613 and associated wiring 614. A second source/drain region 615 is formed at a top portion of the nanofin 616, and a contact 617 is formed thereon. A surrounding gate insulator 618 surrounds the nanofin, and a surrounding gate 619 surrounds and is separated from the nanofin by the gate insulator. At least one gate line 620 is positioned adjacent to the surrounding gate. The gate lines can run in the direction of a long side of the nanofin, or can run in the direction of a short side of the nanofin. As illustrated in FIG. 6A, the width of the drain contact 617 is a minimum feature size (F), and the cross-sectional thickness of the nanofin is substantially less than the minimum feature size. As illustrated in FIG. 6B, the cross-sectional thickness of the nanofin in a second direction orthogonal to the first direction corresponds to the minimum feature size.

U.S. application Ser. No. 11/397,430, filed on Apr. 4, 2006 (U.S. Pub. 20070231985) and U.S. application Ser. No. 11/397,358, filed on Apr. 4, 2006 (U.S. Pub. 20070231980) disclose techniques to fabricate nanofin transistors with reduced volumes and surface areas for the drain region. These reduced volumes and surface areas of silicon for the drain of the transistor result in minimal drain leakage currents and improved retention time of DRAMs. Other expected benefits of the minimal volumes include improved soft error immunity since there is little volume from which to collect charge generated by ionizing radiation, and reduced variable retention times due to defects in the bulk of the wafer.

FIGS. 7A-7L illustrate a process for forming a nanofin transistor, according to various embodiments of the present subject matter. This process grows a crystalline nanofin from an amorphous structure, as described in U.S. application Ser. No. 11/397,430, filed on Apr. 4, 2006 (U.S. Pub. 20070231985), which has been incorporated by reference in its entirety.

Figure 7A:
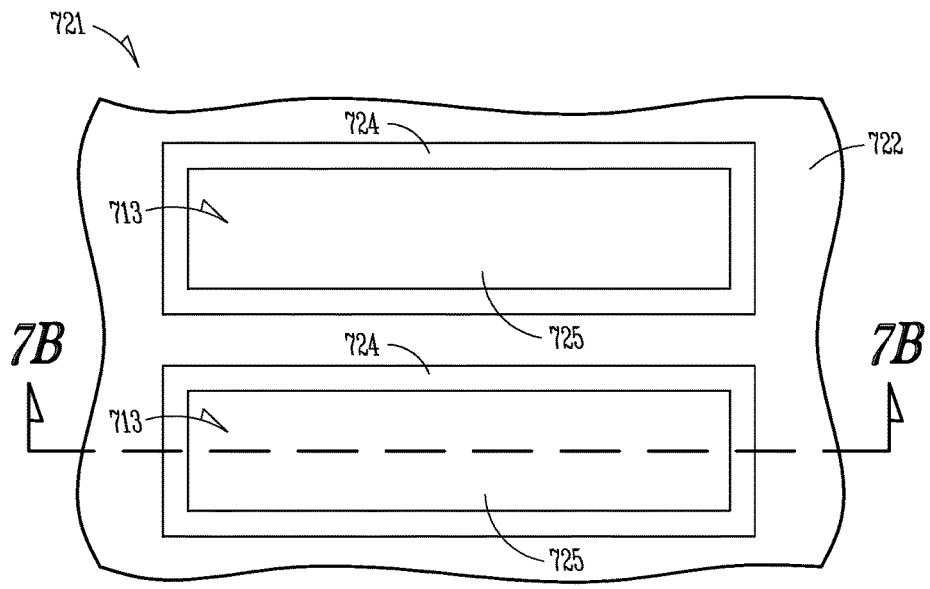
FIGS. 7A-7L illustrate a process for forming a nanofin transistor, according to various embodiments of the present subject matter.
Figure 7B:
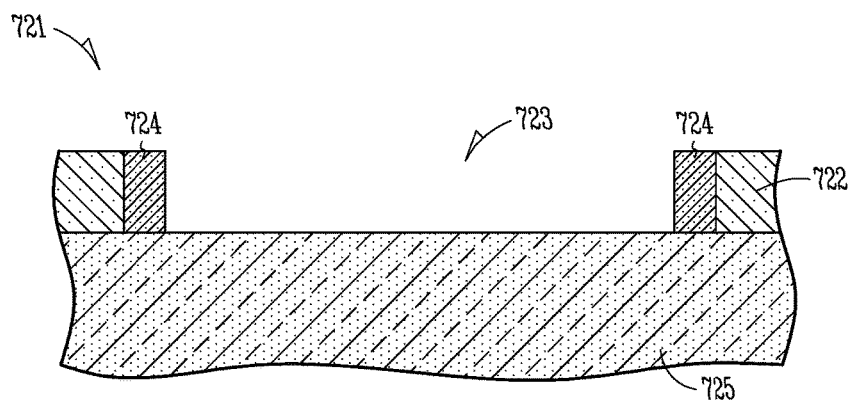

FIGS. 7A and 7B illustrate a top view and a cross-section view along 7B-7B, respectively, of a semiconductor structure 721 with a silicon nitride layer 722, holes 723 in the silicon nitride layer, and sidewall spacers 724 of amorphous silicon along the walls of the holes. The holes are etched in the silicon nitride layer, and amorphous silicon deposited and directionally etched to leave only on the sidewalls. The holes 723 are etched through the silicon nitride layer 722 to a silicon wafer or substrate 725.

Figure 7C:
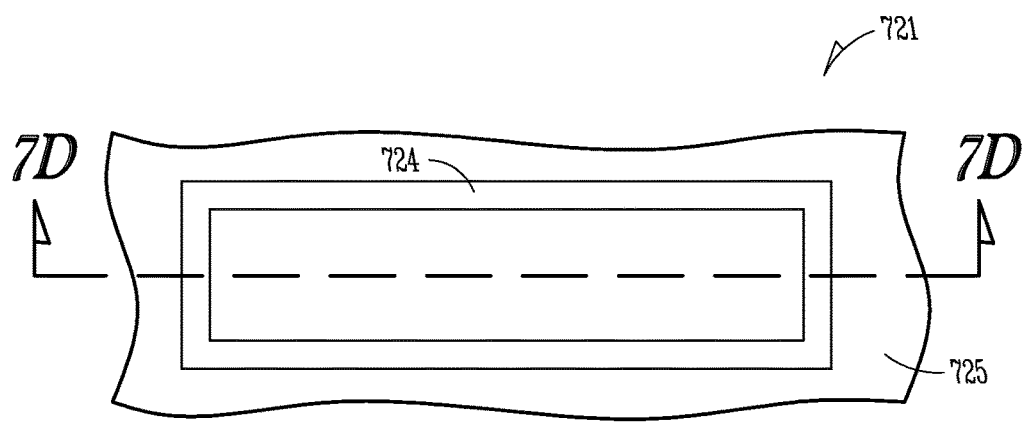
Figure 7D:
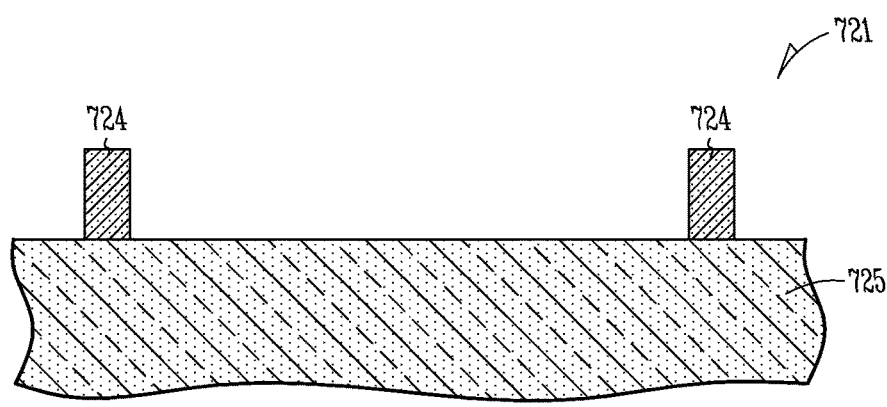

FIGS. 7C and 7D illustrate a top view and a cross-section view along line 7D-7D, respectively, of the structure after the silicon nitride layer is removed. As illustrated, after the silicon nitride layer is removed, the sidewalls 724 are left as standing narrow regions of amorphous silicon. The resulting patterns of standing silicon can be referred to as "racetrack" patterns, as they have a generally elongated rectangular shape. The width of the lines is determined by the thickness of the amorphous silicon rather than masking and lithography. For example, the thickness of the amorphous silicon may be on the order of 20 nm to 50 nm, according to various embodiments. A solid phase epitaxial (SPE) growth process is used to recrystallize the standing narrow regions of amorphous silicon. The SPE growth process includes annealing, or heat treating, the structure to cause the amorphous silicon to crystallise, beginning at the interface with the silicon substrate 725 which functions as a seed for crystalline growth up through the remaining portions of the standing narrow regions of silicon.

Figure 7E:
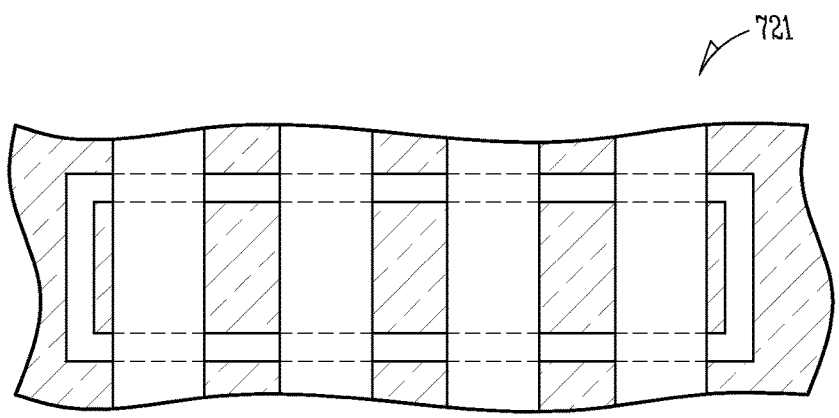
Figure 7F:
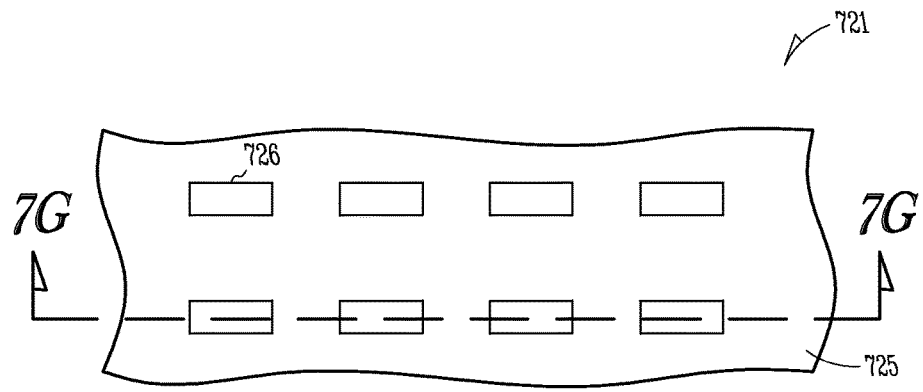
Figure 7G:
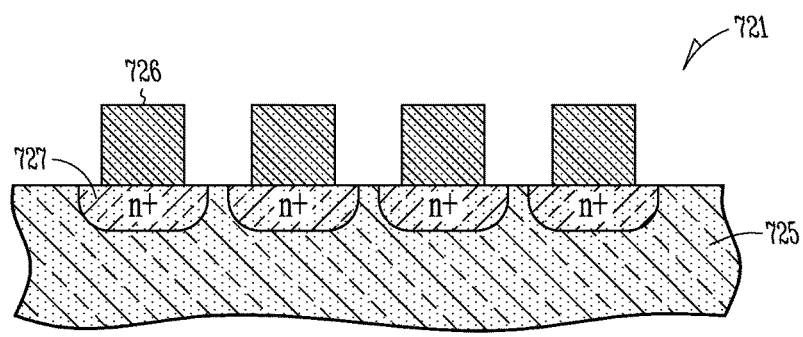

FIG. 7E illustrates a top view of the structure 721, after a mask layer has been applied. The shaded areas are etched, leaving free-standing fins formed of crystalline silicon. FIGS. 7F and 7G illustrate a top view and a cross-section view along line 7G-7G, respectively, of the pattern of free-standing fins 726. A buried doped region 727 functions as a first source/drain region. According to various embodiments, the buried doped region can be patterned to form a conductive line either the row or column direction of the array of fins.

Figure 7H:
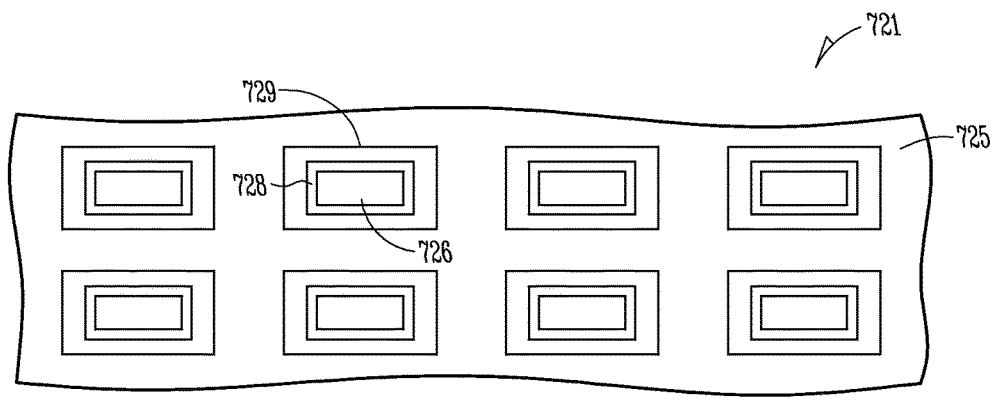

FIG. 7H illustrates a top view of the structure, where the fins have been surrounded by a gate insulator 728 and a gate 729. The gate insulator can be deposited or otherwise formed in various ways. For example, a silicon oxide can be formed on the silicon fin by a thermal oxidation process. The gate can be any gate material, such as polysilicon or metal. The gate material is deposited and directionally etched to leave the gate material only on the sidewalls of the fin structure with the gate insulator. The wiring can be oriented in either the "x-direction" or "y-direction."

Figure 7I:
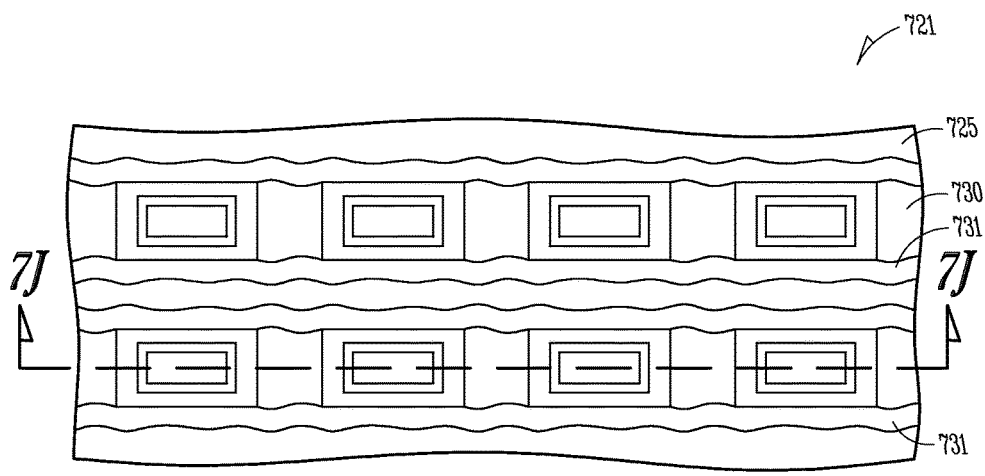
Figure 7J:
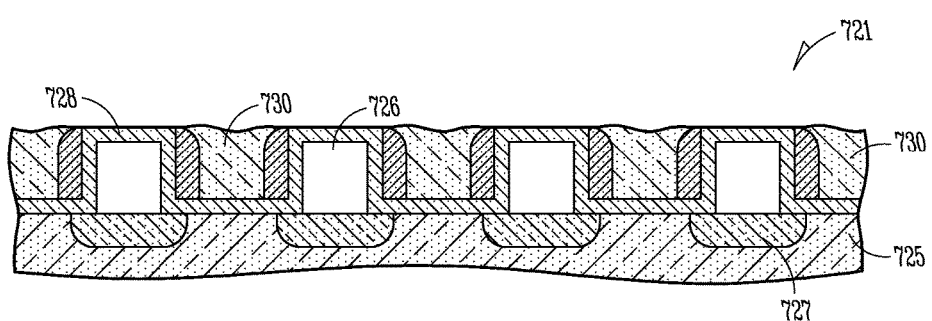

FIGS. 7I and 7J illustrate a top view and a cross-section view along line 7J-7J, respectively, of the structure illustrated in FIG. 7H after the structure is backfilled with an insulator 730 and gate wiring 731 is formed in an "x-direction" along the long sides of the fins. Various embodiments backfill the structure with silicon oxide. Trenches are formed in the backfilled insulator to pass along a side of the fins, and gate lines are formed in the trenches. In various embodiments, one gate line passes along one side of the fins, in contact with the surrounding gate of the fin structure. Some embodiments provide a first gate line on a first side of the fin and a second gate line on a second side of the fin. The gate wiring material, such as polysilicon or metal, can be deposited and directionally etched to leave on the sidewalls only. The gate wiring material appropriately contacts the surrounding gates for the fins. In various embodiments, the gate material and gate wiring material are etched to recess the gate and gate wiring below the tops of the fins. The whole structure can be backfilled with an insulator, such as silicon oxide, and planarized to leave only oxide on the surface. The top of the pillars or fins can be exposed by an etch. A second source/drain region 732 can be implanted in a top portion of the fins, and metal contacts 733 to the drain regions can be made by conventional techniques. The metal wiring can run, for example, in the "x-direction" and the buried source wiring can run perpendicular, in the plane of the paper in the illustration.

Figure 7K:
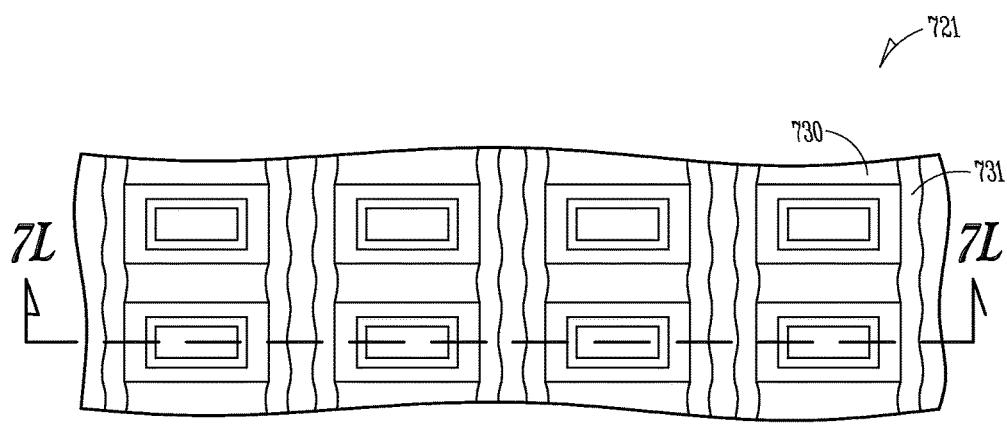
Figure 7L:
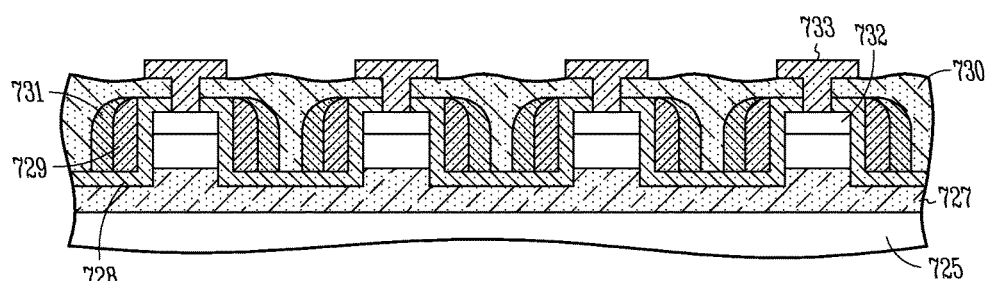

FIGS. 7K and 7L illustrate a top view and a cross-section view along line 7L-7L, respectively, of the structure after the structure is backfilled with an insulator and gate wiring is formed in an "y-direction" along the short sides of the fins. Trenches are opened up along the side of the fins in the "y-direction." Gate wiring material 731, such as polysilicon or metal, can be deposited and directionally etched to leave on the sidewalls only and contacting the gates on the fins. In various embodiments, the gate material and gate wiring material are etched to recess the gate and gate wiring below the tops of the fins. The whole structure can be backfilled with an insulator 730, such as silicon oxide, and planarized to leave only the backfill insulator on the surface. Contact openings and drain doping regions can then be etched to the top of the pillars and drain regions implanted and metal contacts to the drain regions made by conventional techniques. The metal wiring can run, for example, perpendicular to the plane of the paper in the illustration and the buried source wiring runs in the "x-direction." The buried source/drains are patterned and implanted before deposition of the amorphous silicon. FIG. 7L gives an illustration of one of the completed fin structures with drain/source regions, recessed gates, and source/drain region wiring. These nanofin FET's can have a large W/L ratio and are able to conduct more current than nanowire FET's.

FIGS. 8A-8L illustrate a process for forming a nanofin transistor, according to various embodiments of the present subject matter. This process etches a crystalline nanofin from a crystalline substrate, as described in U.S. application Ser. No. 11/397,358, filed on Apr. 4, 2006 (U.S. Pub. 20070231980), which has been incorporated by reference in its entirety.

Figure 8A:
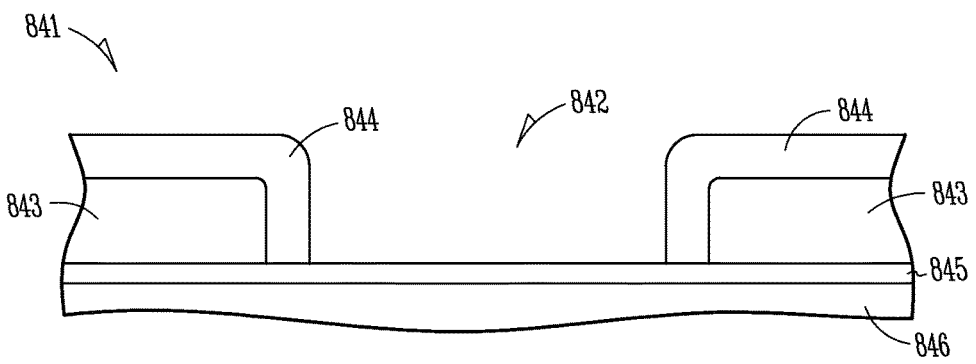
FIGS. 8A-8L illustrate a process for forming a nanofin transistor, according to various embodiments of the present subject matter.
Figure 8B:
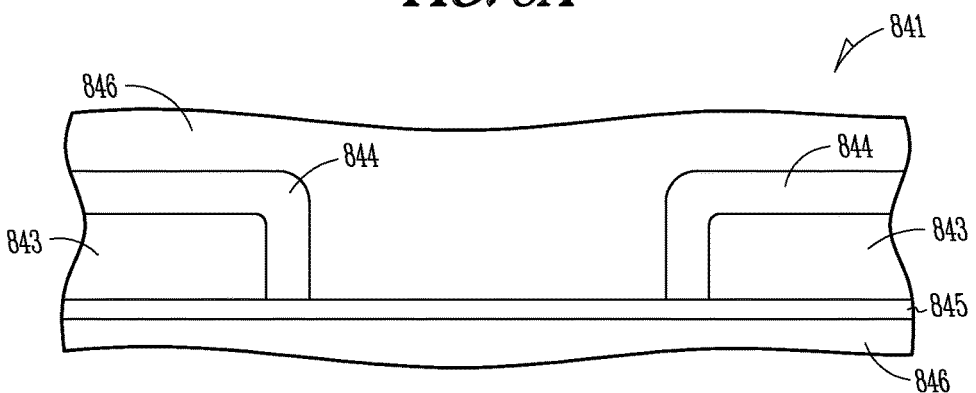
Figure 8C:
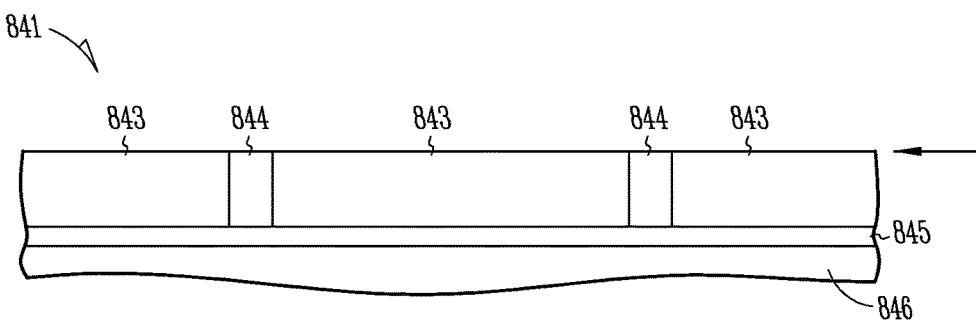

According to an embodiment, silicon nitride is deposited on a silicon wafer, and the silicon nitride is covered with a layer of amorphous silicon (α-silicon). FIG. 8A illustrates a side view of the structure 841 after holes 842 are defined in the amorphous silicon 843 and sidewall spacers 844 are formed. The holes 842 extend to the silicon nitride layer 845, which lies over a substrate 846 such as a silicon wafer. Various embodiments form the sidewall spacers by oxidizing the amorphous silicon. FIG. 8B illustrates a side view of the structure 841, after the structure is covered with a thick layer of amorphous silicon 846. FIG. 8C illustrates the structure 841 after the structure is planarized, illustrated by the arrow, at least to a level to remove the oxide on top of the amorphous silicon. The structure can be planarized using a chemical mechanical polishing (CMP) process, for example. This leaves an elongated rectangular pattern, also referred to as a "racetrack" pattern, of oxide 844 exposed on the surface. The width of the pattern lines is determined by the oxide thickness rather than masking and lithography. For example, the oxide thickness can be within a range on the order of 20 nm to 50 nm, according to various embodiments.

Figure 8D:
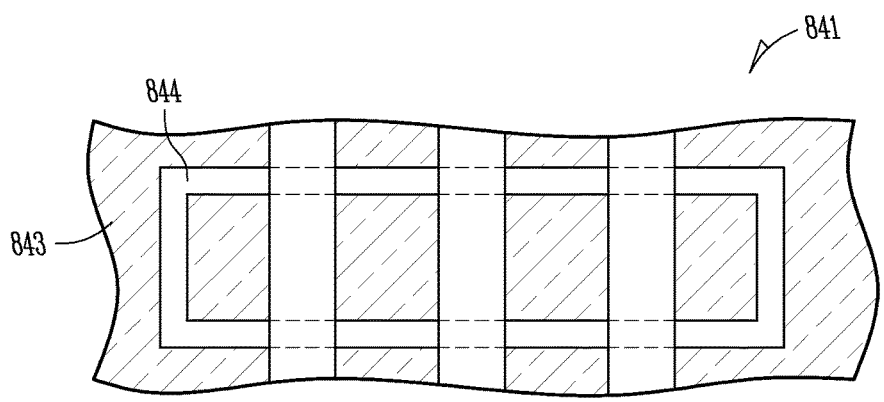
Figure 8E:
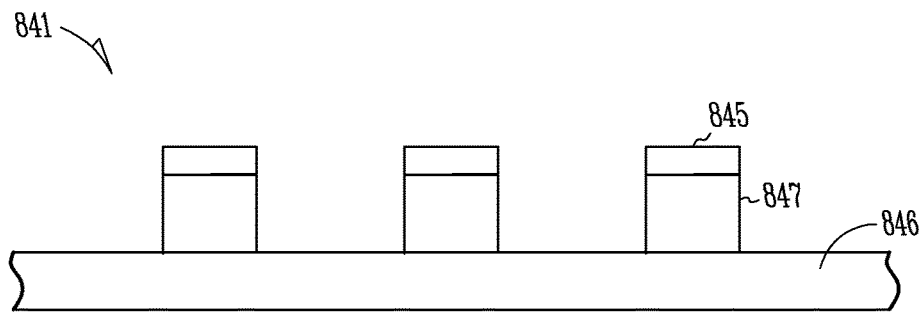
Figure 8F:
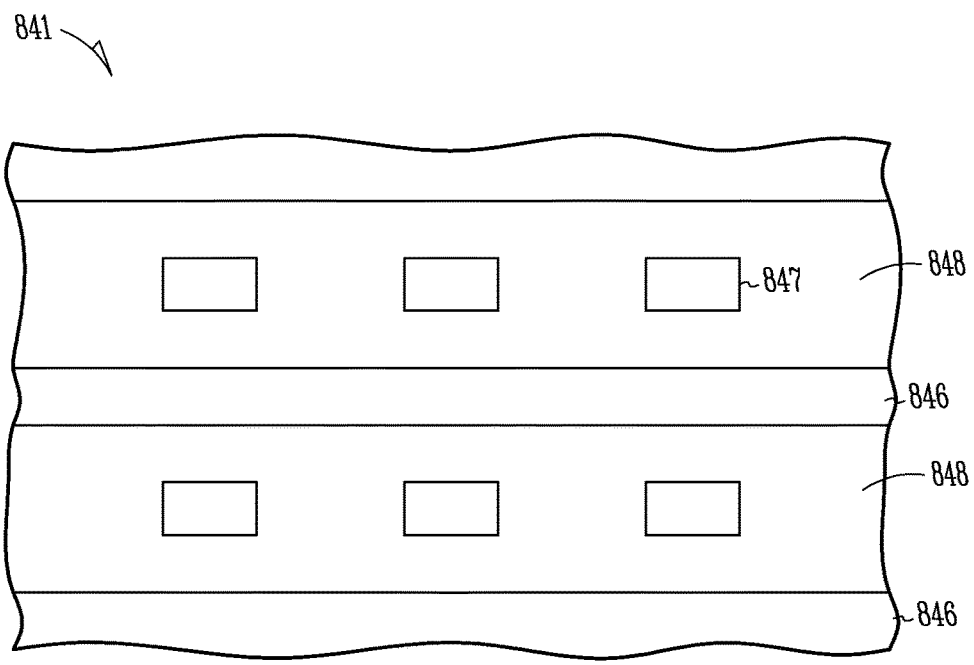
Figure 8G:
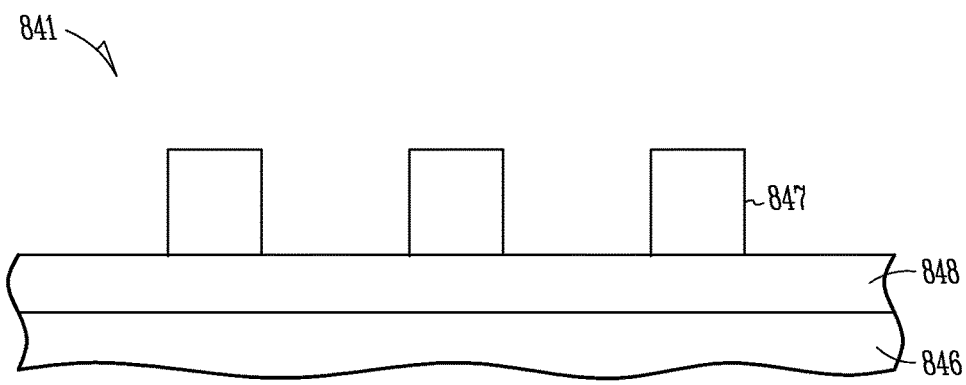

FIG. 8D illustrates a mask over the racetrack pattern, which selectively covers portions of the oxide and exposes other portions of the oxide. The exposed oxide portions, illustrated by the shaded strips, are removed. An etch process, such as a potassium hydroxide (KOH) etch, is performed to remove the amorphous silicon. The oxide, or the portions of the oxide remaining after the mask and etch illustrated in FIG. 8D, protects the nitride during the etch. After the amorphous silicon is removed the nitride 845 can be etched, followed by a directional silicon etch that etches the wafer 846 to a predetermined depth below the nitride layer. The nitride pattern protects the local areas of silicon from the etch, resulting in silicon fins 847 of silicon protruding from the now lower surface of the silicon wafer, as illustrated in FIG. 8E. FIGS. 8F and 8G illustrate top and side views of the structure, after the tops of the fins and trenches at the bottom of the fins are implanted with a dopant. As illustrated in FIG. 8F, the dopant in the trench forms a conductive line 848 (e.g. source line). The dopant also forms a source/drain region at the bottom or a bottom portion of the fin. Because the fins are extremely thin, the doping in the trench is able to diffuse completely under the fins. The strips can be in either the row or column direction.

Figure 8H:
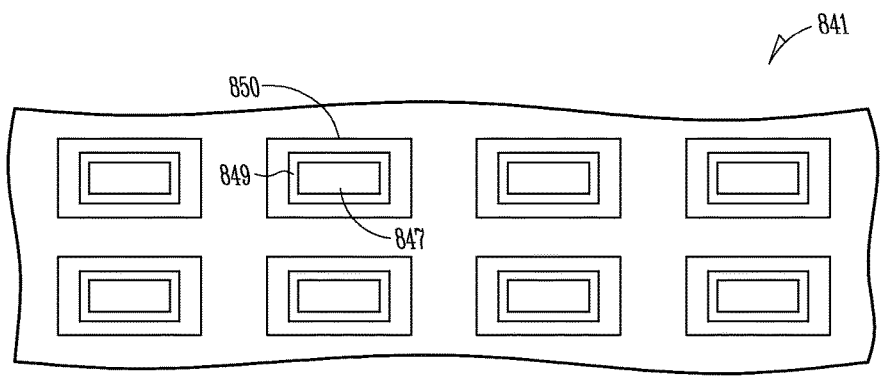

FIG. 8H illustrates the structure 841 after a gate insulator 849 has been formed around the fin 847, and a gate material 850 is formed around and separated from the fin by the gate insulator. For example, an embodiment oxidizes the silicon fins using a thermal oxidation process. The gate material 850 may be polysilicon or metal, according to various embodiments.

Figure 8I:
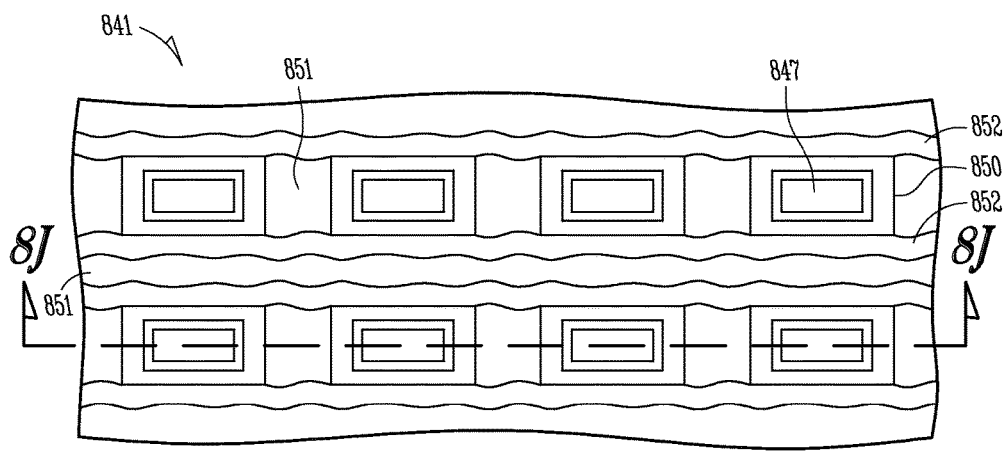
Figure 8J:
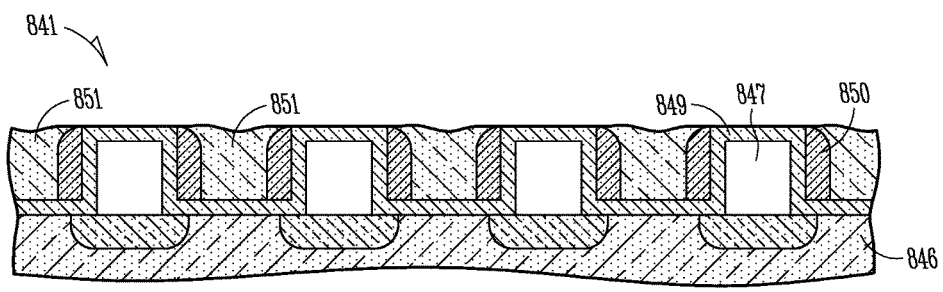

FIGS. 8I and 8J illustrate a top view and a cross-section view along line 8J-8J, respectively, of a first array embodiment. The structure 841 is backfilled with an insulator 851 (e.g. oxide) and trenches are created on the sides of the fins. Gate wiring material 852, such as polysilicon or metal, can be deposited and directionally etched to leave on the sidewalls only and contacting the surrounding gates 850 for the fins. The gate material and gate wiring material can be etched to recess it below the tops of the fins. The whole structure can be again backfilled with oxide and planarized to leave only oxide on the surface. Contact openings and drain doping regions can then be etched to the top of the pillars and drain regions implanted and metal contacts to the drain regions made by conventional techniques. In this case, the metal wiring could run in the "x-direction" and the buried source wiring could run perpendicular to the plane of the paper in the illustration.

Figure 8K:
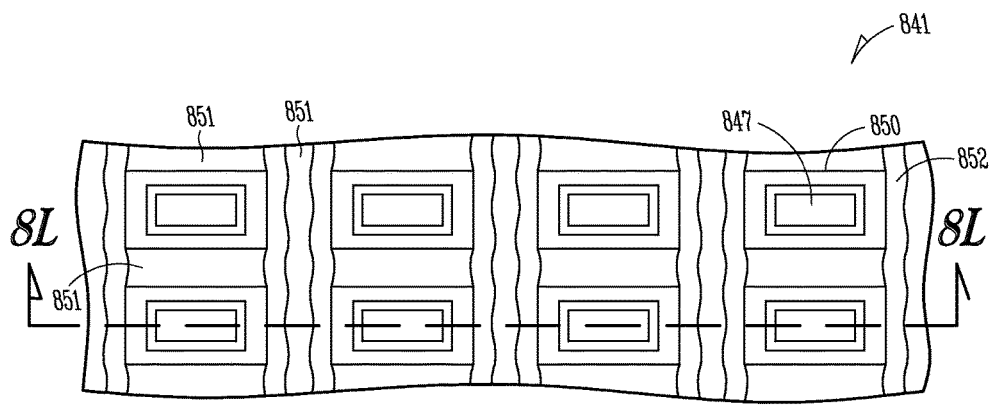
Figure 8L:
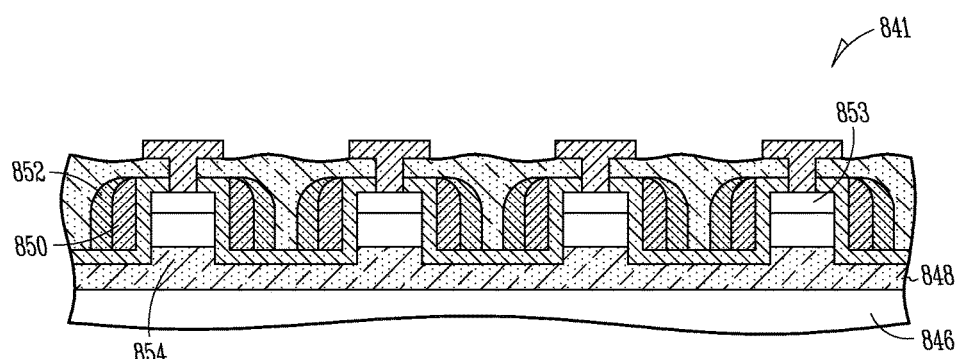

FIGS. 8K and 8L illustrate a top view and a cross-section view along 8L-8L, respectively, of a second array embodiment. The structure 841 is backfilled with an insulator 851 (e.g. oxide) and trenches are created along the side of the fins 847, in the "y-direction". Gate wiring material 852, such as polysilicon or metal, can be deposited and directionally etched to leave on the sidewalls only and contacting the gates on the fins. The gate material and gate wiring material can be etched to recess it below the tops of the fins. The whole structure can be backfilled with an insulator (e.g. oxide) and planarized to leave only oxide on the surface. Contact openings and drain doping regions can then be etched to the top of the pillars and drain regions implanted and metal contacts to the drain regions made by conventional techniques. In this case, the metal wiring could run perpendicular to the plane of the paper in the illustration and the buried source wiring could run in the "x-direction".

In both the first and second array embodiments, the buried source/drains can be implanted before the formation of the surrounding gate insulator and surrounding gate. FIG. 8L illustrates one of the completed fin structures with drain/source regions 853 and 854, recessed gates 850, and source/drain region wiring 848. These nanofin FET's can have a large W/L ratio and will conduct more current than nanowire FET's.

Figure 9A:
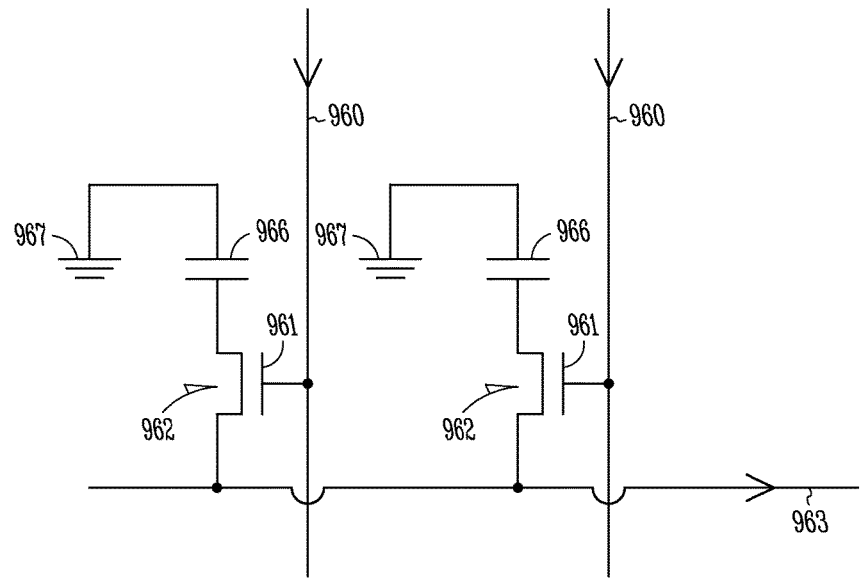
Figure 9B:
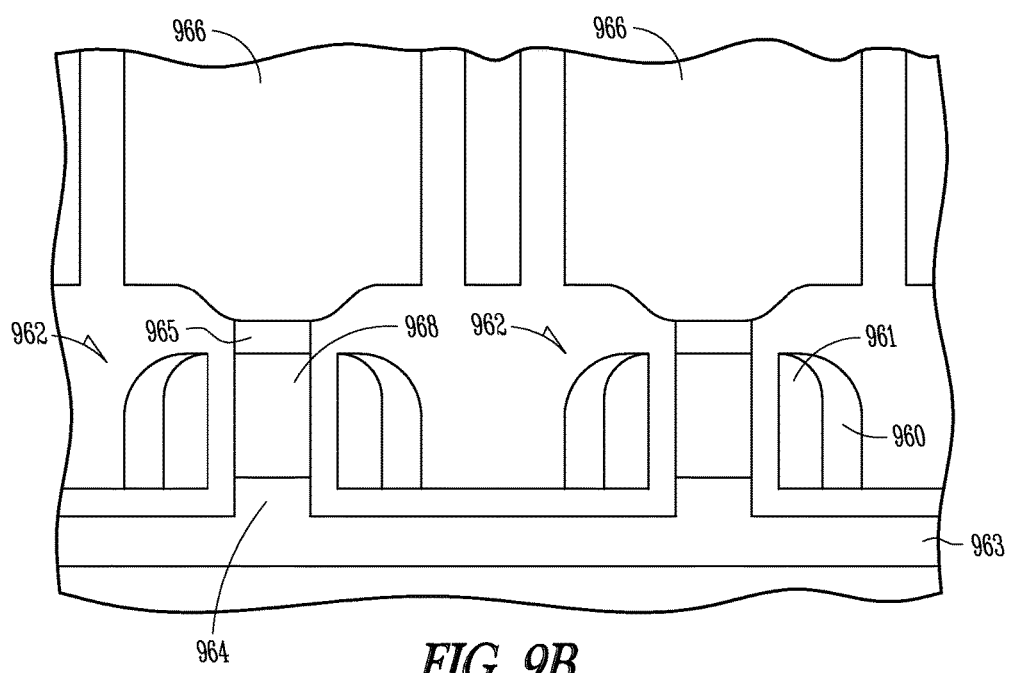

FIGS. 9A-9C illustrate the application of FINFET's as DRAM access transistors with buried data-bit lines, according to various embodiments of the present subject matter. Word lines 960 are connected to the gates 961 of the nanofin access transistors 962, and a data-bit line 963 is connected to a first source/drain region 964 (the drain for conventional operating voltages). A second source/drain region 965 (the source for conventional operating voltages) is connected to a stacked capacitor 966, which is connected to a common potential 967. FIG. 9A illustrates a schematic of an array configuration where the word lines 960 drive the gates 961 on each side of the fin 968, and the data-bit line 963 is a buried line (e.g. N+ implanted and diffused region) as shown in FIG. 9B. FIG. 9C illustrates the application with a global bit line to reduce data-bit line series resistance, a column is sacrificed and the data-bit line signal brought to the surface under the stacked capacitors and in part over the isolation area as in a conventional stacked capacitor DRAM. The transistors in the column are used to connect the local data-bit line to the metal global data-bit line 969.

Figure 10A:
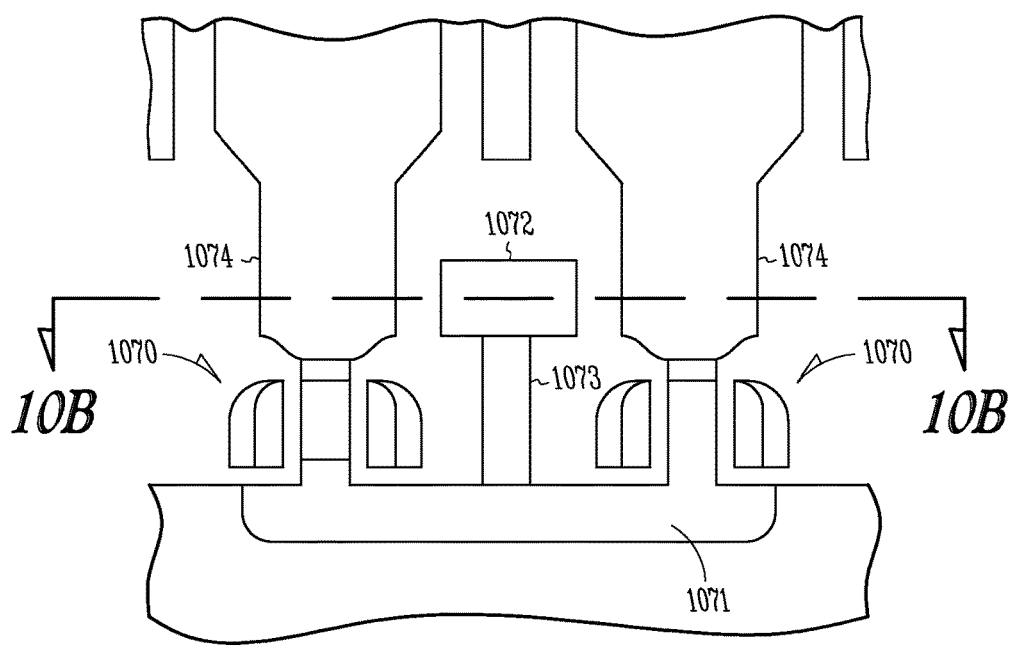
FIGS. 10A-10B illustrate side and top views, respectively, of another embodiment in which FINFETs function as DRAM access transistors.
Figure 10B:
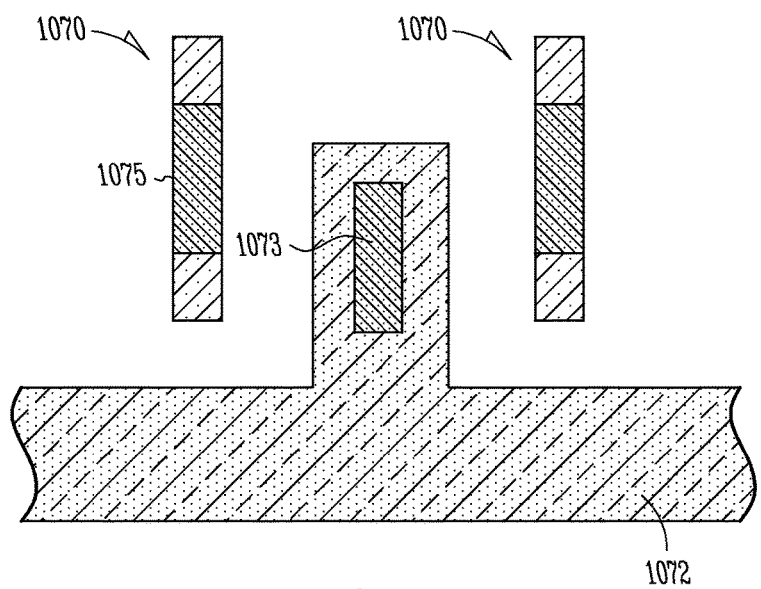

FIG. 10A-10B illustrate side and top views, respectively, of another embodiment in which FINFETs function as DRAM access transistors. Two access transistors 1070 share a first source/drain region 1071 (e.g. shared source) which is contacted by a metal data-bit line 1072 using a contact plug 1073. This metal data-bit line is on the surface under the stacked capacitors 1074 and over in part the isolation areas. The metal bit lines have a lower series resistance than the buried bit lines 963 shown in FIGS. 9A-9C. Also illustrated in FIG. 10B is a contact area 1075 between the capacitor 1074 and the transistor 1070.

The present subject matter provides DRAM access transistors with ultrathin fin-shaped bodies to minimize sub-threshold leakage and junction leakage, as a result of the extremely small drain regions and surface areas. The small volume reduces soft error rates and variable retention times. Thus, the design of the present subject matter improves DRAM retention time, requires smaller stacked storage capacitors, and reduces the adverse effects of variable retention times.

Figure 11:
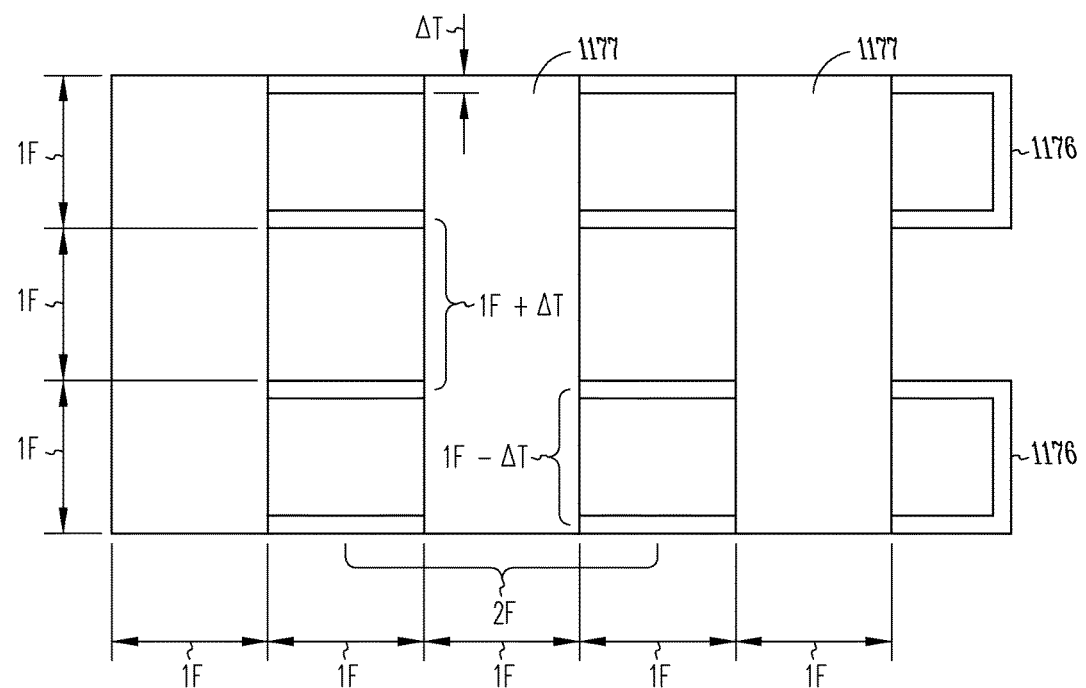
FIG. 11 illustrates a top view of a layout of nanofins for an array of nanofin transistors, according to various embodiments.

FIG. 11 illustrates a top view of a layout of nanofins for an array of nanofin transistors, according to various embodiments. The figure illustrates two "racetracks" of sidewall spacers 1176, and further illustrates the portions of the sidewall spacers removed by an etch. The holes used to form the sidewall spacer tracks were formed with a minimum feature size (1F). The mask strips 1177 have a width of a minimum feature size (1F) and are separated by a minimum feature size (1F). In the illustrated layout, the columns of the nanofins have an approximately 2F center-to-center spacing, and the rows of the nanofins have an approximately 1F center-to-center spacing. Also, as illustrated in FIG. 7, since the nanofins are formed from sidewall spacers on the walls of the holes, the center-to-center spacing between first and second rows will be slightly less than 1F size by an amount corresponding to the thickness of the nanofins (1F−ΔT), and the center-to-center spacing between second and third rows will be slightly more than 1F by an amount corresponding to the thickness of the nanofins (1F+ΔT). In general, the center-to-center spacing between first and second rows will be slightly less than a feature size interval (NF) by an amount corresponding to the thickness of the nanofins (NF−ΔT), and the center-to-center spacing between second and third rows will be slightly more than a feature size interval (NF) by an amount corresponding to the thickness of the nanofins (NF+ΔT).

Figure 12:
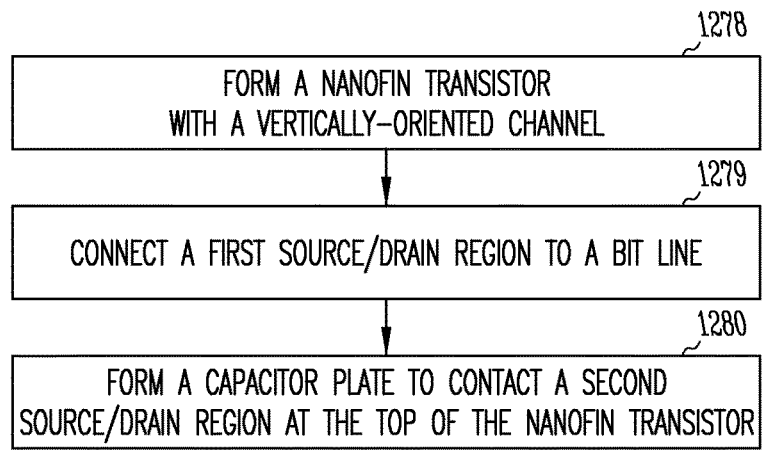
FIG. 12 illustrates a method for forming a DRAM with a nanofin transistor, according to various embodiments.

FIG. 12 illustrates a method for forming a DRAM with a nanofin transistor, according to various embodiments. A nanofin transistor with a vertically-oriented channel is formed at 1278. The nanofin can be grown from a substrate or etched from the substrate, as provided above. A first source/drain region for the transistor is connected to a bit line at 1279. Embodiments for connecting the first source/drain region to a bit line are provided in FIGS. 13-14. At 1280, a capacitor plate is formed to contact a second source/drain region at the top of the nanofin transistor.

Figure 13:
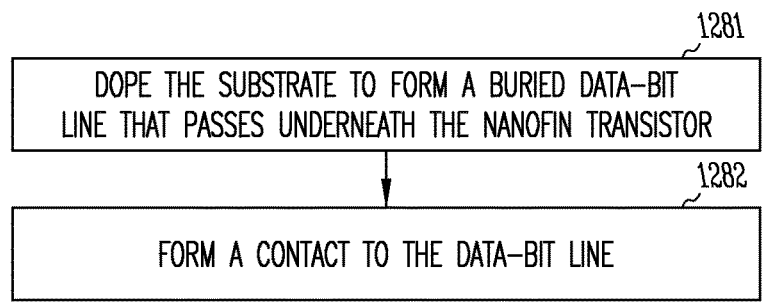
FIG. 13 illustrates one method for connecting a first source/drain region to a bit line, according to various embodiments.

FIG. 13 illustrates one method for connecting a first source/drain region to a bit line, according to various embodiments. The bit line is a doped line in the substrate. The substrate is doped to form a buried data-bit line that passes underneath the nanofin transistor at 1381. The nanofin is thin, allowing the dopant to diffuse completely underneath the transistor. At 1382, a contact to the data-bit line is formed.

Figure 14:
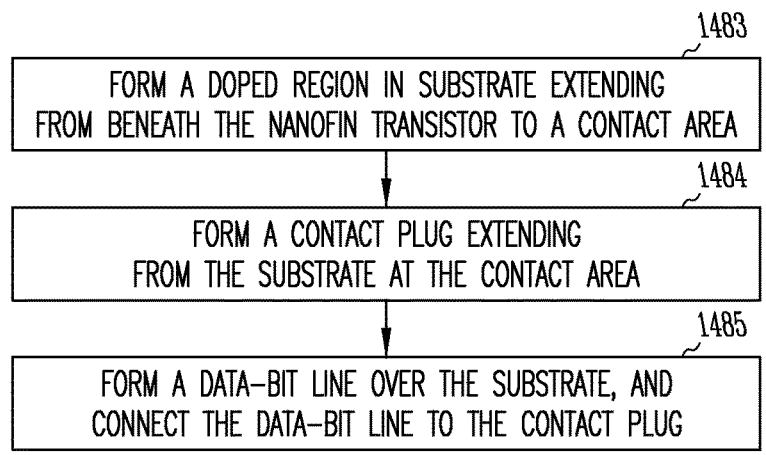
FIG. 14 illustrates another method for connecting a first source/drain region to a bit line, according to various embodiments.

FIG. 14 illustrates another method for connecting a first source/drain region to a bit line, according to various embodiments. A metal bit line is formed over a substrate. At 1483, a doped region is formed in a substrate. The doped region extends from beneath the nanofin transistor to a contact area. At 1484, a contact plug is formed that extends from the substrate at the contact area. At 1485, a data-bit line is formed over the substrate, and the data-bit line is connected to the contact plug.

Figure 15:
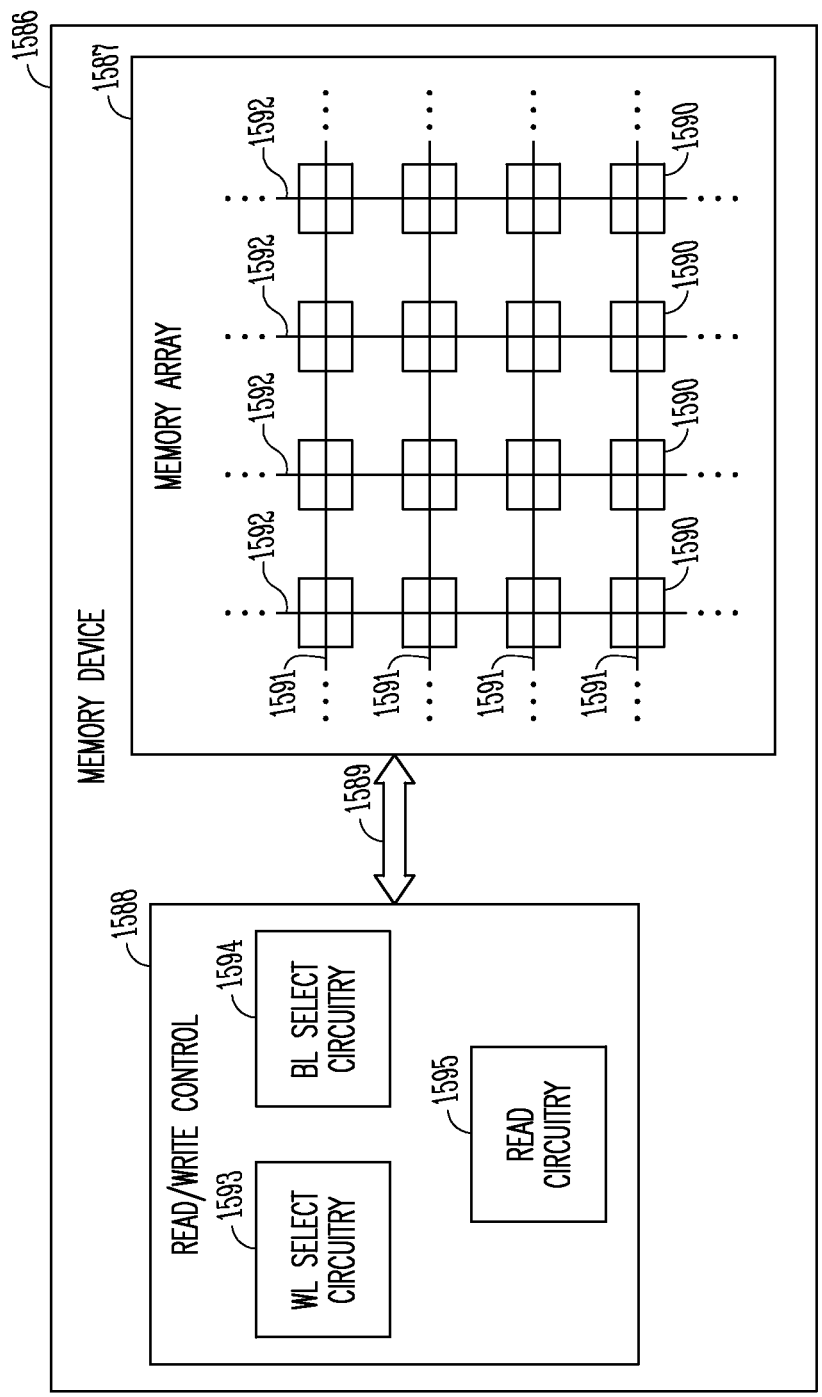
FIG. 15 is a simplified block diagram of a high-level organization of various embodiments of a memory device according to various embodiments of the present subject matter.

FIG. 15 is a simplified block diagram of a high-level organization of various embodiments of a memory device according to various embodiments of the present subject matter. The illustrated memory device 1586 includes a memory array 1587 and read/write control circuitry 1588 to perform operations on the memory array via communication line(s) or channel(s) 1589. The illustrated memory device 1586 may be a memory card or a memory module such as a single inline memory module (SIMM) and dual inline memory module (DIMM). One of ordinary skill in the art will understand, upon reading and comprehending this disclosure, that the memory device can include the DRAM with nanofin transistors, as described above.

The memory array 1587 includes a number of memory cells 1590. The memory cells in the array are arranged in rows and columns. In various embodiments, word lines 1591 connect the memory cells in the rows, and bit lines 1592 connect the memory cells in the columns. The read/write control circuitry 1588 includes word line select circuitry 1593 which functions to select a desired row, bit line select circuitry 1594 which functions to select a desired column, and read circuitry 1595 which functions to detect a memory state for a selected memory cell in the memory array 1587.

Figure 16:
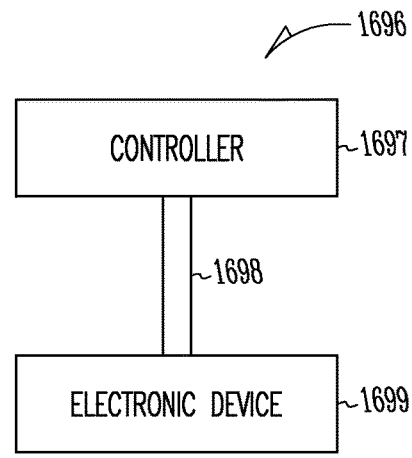
FIG. 16 illustrates a diagram for an electronic system having a DRAM with nanofin transistors, according to various embodiments.

FIG. 16 illustrates a diagram for an electronic system 1696 having a DRAM with nanofin transistors, according to various embodiments. Electronic system 1696 includes a controller 1697, a bus 1698, and an electronic device 1699, where the bus 1698 provides communication channels between the controller 1697 and the electronic device 1699. The illustrated electronic system 1696 may include, but is not limited to, information handling devices, wireless systems, telecommunication systems, fiber optic systems, electro-optic systems, and computers.

Figure 17:
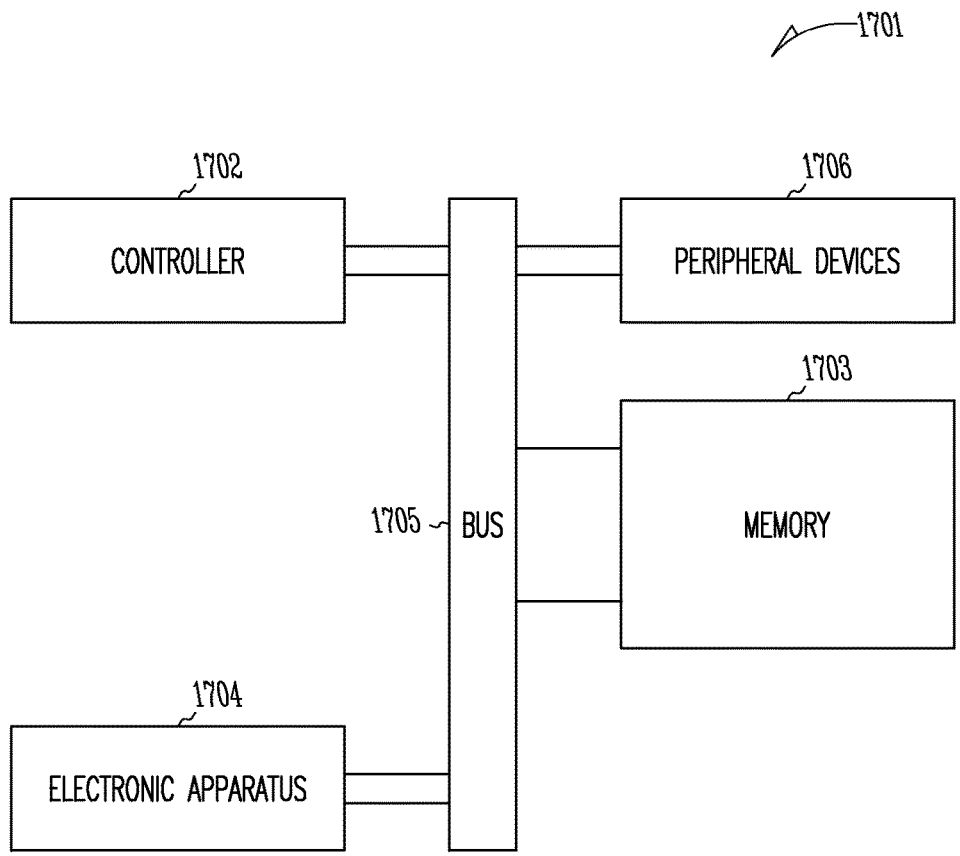
FIG. 17 depicts a diagram of an embodiment of a system having a controller and a memory.

FIG. 17 depicts a diagram of an embodiment of a system 1701 having a controller 1702 and a memory 1703. The system 1701 may include a DRAM with nanofin transistors according to various embodiments. The illustrated system 1701 also includes an electronic apparatus 1704 and a bus 1705 to provide communication channel(s) between the controller and the electronic apparatus, and between the controller and the memory. The bus may include an address, a data bus, and a control bus, each independently configured; or may use common communication channels to provide address, data, and/or control, the use of which is regulated by the controller. In an embodiment, the electronic apparatus 1701 may be additional memory configured similar to memory 1703. An embodiment may include a peripheral device or devices 1706 coupled to the bus 1705. Peripheral devices may include displays, additional storage memory, or other control devices that may operate in conjunction with the controller and/or the memory. In an embodiment, the controller is a processor. The system 1701 may include, but is not limited to, information handling devices, telecommunication systems, and computers. Such circuitry can further be a subcomponent of a variety of electronic systems, such as a clock, a television, a cell phone, a personal computer, an automobile, an industrial control system, an aircraft, and others.

This disclosure includes several processes, circuit diagrams, and cell structures. The present subject matter is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing the above description. The scope of the present subject matter should be determined with reference to the appended claims, along with the full scope of equivalents to which such claims are entitled.

What is claimed is:

1. A method of forming a semiconductor structure, comprising:

forming a nanofin transistor having a first source/drain region, a second source/drain region above the first source/drain region, and a vertically-oriented channel region between the first and second source/drain regions, the nanofin transistor including a nanofin structure with a sublithographic cross-sectional dimension and a surrounding gate insulator around the nanofin structure and a surrounding gate surrounding the nanofin structure and separated from the nanofin structure by the surrounding gate insulator, wherein forming the nanofin structure includes forming a sidewall spacer with a desired thickness to provide the nanofin structure with a sublithographic cross-sectional thickness that corresponds to the desired thickness of the sidewall spacer, wherein forming a sidewall spacer includes forming an amorphous sidewall spacer, and forming a nanofin transistor includes recrystallizing the amorphous sidewall spacer into a crystalline silicon nanofin structure on a substrate; and forming a stacked capacitor positioned above the nanofin structure and connected to the second source/drain region.

2. The method of claim 1 further comprising connecting a buried doped conductor to the first source/drain region.

3. The method of claim 1, wherein the channel region is formed in a nanofin structure having a cross-sectional thickness in a first direction less than a minimum feature length and a cross-sectional thickness in a second direction orthogonal to the first that corresponds to the minimum feature size.

4. The method of claim 1, wherein forming a nanofin transistor includes forming a crystalline silicon nanofin structure.

5. The method of claim 1, wherein the sublithographic cross-sectional thickness of the nanofin structure is about 20 nm to 50 nm.

6. The method of claim 1, further comprising forming an array of transistors arranged in columns and rows wherein the nanofin transistor is within the array of transistors, each transistor in the array including a first source/drain region, a second source/drain region above the first source/drain region, a vertically-oriented channel region between the first and second source/drain regions, and a surrounding gate around the channel region, the channel region being formed in a crystalline semiconductor fin having a cross-sectional thickness that is substantially less than a minimum feature size (F);

wherein a first row and an adjacent second row has a center-to-center spacing of the minimum feature size interval (NF) less the thickness of the fin structures, and the second row and an adjacent third row has a center-to-center spacing of the minimum feature size interval (NF) plus the thickness of the fin structures.

7. A method of forming a semiconductor structure, comprising:

forming a nanofin transistor having a first source/drain region, a second source/drain region above the first source/drain region, and a vertically-oriented channel region between the first and second source/drain regions, wherein forming the nanofin transistor includes forming a nanofin structure with a sublithographic cross-sectional dimension and a surrounding gate insulator around the nanofin structure and a surrounding gate surrounding the nanofin structure and separated from the nanofin structure by the surrounding gate insulator, wherein forming the nanofin structure includes forming a sidewall spacer with a desired thickness to provide the nanofin structure with a sublithographic cross-sectional thickness that corresponds to the desired thickness of the sidewall spacer, wherein the nanofin structure is formed directly beneath the sidewall spacer; and forming a stacked capacitor positioned above the nanofin structure and connected to the second source/drain region.

8. The method of claim 7, further comprising connecting a buried doped conductor to the first source/drain region.

9. The method of claim 7, wherein forming a nanofin transistor includes etching a crystalline wafer, using the sidewall spacer as a mask, to define a crystalline silicon nanofin structure.

10. The method of claim 7, wherein forming a nanofin transistor includes forming a crystalline silicon nanofin structure.

11. The method of claim 7, wherein the sublithographic cross-sectional thickness of the nanofin structure is about 20 nm to 50 nm.

12. The method of claim 7, further comprising forming an array of transistors arranged in columns and rows wherein the nanofin transistor is within the array of transistors, each transistor in the array including a first source/drain region, a second source/drain region above the first source/drain region, a vertically-oriented channel region between the first and second source/drain regions, and a surrounding gate around the channel region, the channel region being formed in a crystalline semiconductor fin having a cross-sectional thickness that is substantially less than a minimum feature size (F);

wherein a first row and an adjacent second row has a center-to-center spacing of the minimum feature size interval (NF) less the thickness of the fin structures, and the second row and an adjacent third row has a centerto-center spacing of the minimum feature size interval (NF) plus the thickness of the fin structures.

13. A method of forming a semiconductor structure comprising:

forming an array of transistors arranged in columns and rows, each transistor including a first source/drain region, a second source/drain region above the first source/drain region, a vertically-oriented channel region between the first and second source/drain regions, and a surrounding gate around the channel region, the channel region being formed in a crystalline semiconductor fin having a cross-sectional thickness that is substantially less than a minimum feature size (F); and forming a stacked capacitor positioned above each transistor and connected to the second source/drain region, wherein a first row and an adjacent second row has a center-to-center spacing of the minimum feature size interval (NF) less the thickness of the fin structures, and the second row and an adjacent third row has a center-to-center spacing of the minimum feature size interval (NF) plus the thickness of the fin structures.

14. The method of claim 13, further comprising connecting a buried doped conductor to the first source/drain region.

15. The method of claim 13, wherein the sublithographic cross-sectional thickness of the nanofin structure is about 20 nm to 50 nm.

16. The method of claim 13, wherein forming the array of transistors includes forming an array of crystalline silicon nanofins.

17. A method of forming a semiconductor structure, comprising:

forming a nanofin transistor having a first source/drain region, a second source/drain region above the first source/drain region, and a vertically-oriented channel region between the first and second source/drain regions, wherein forming the nanofin transistor includes forming a crystalline silicon nanofin structure with a cross-sectional thickness in a first direction less than a minimum feature length and a cross-sectional thickness in a second direction orthogonal to the first that corresponds to the minimum feature size, and wherein forming the nanofin transistor includes etching a crystalline substrate to define the crystalline silicon nanofin structure; and forming a stacked capacitor positioned above the nanofin structure and connected to the second source/drain region, wherein forming the nanofin transistor includes forming a sidewall spacer with a desired thickness to provide the nanofin structure with a sublithographic cross-sectional thickness that corresponds to the desired thickness of the sidewall spacer, and wherein etching the crystalline substrate to define the crystalline silicon nanofin structure includes using the sidewall spacer as a mask in a process to etch the crystalline silicon nanofin structure from the substrate, wherein the crystalline silicon nanofin structure is formed directly beneath the sidewall spacer.

18. The method of claim 17, further comprising connecting a buried doped conductor to the first source/drain region.

19. The method of claim 17, wherein the sublithographic cross-sectional thickness of the nanofin structure is about 20 nm to 50 nm.

20. The method of claim 17, further comprising forming an array of transistors arranged in columns and rows wherein the nanofin transistor is within the array of transistors, each transistor in the array including a first source/drain region, a second source/drain region above the first source/drain region, a vertically-oriented channel region between the first and second source/drain regions, and a surrounding gate around the channel region, the channel region being formed in a crystalline semiconductor fin having a cross-sectional thickness that is substantially less than a minimum feature size (F);

wherein a first row and an adjacent second row has a center-to-center spacing of the minimum feature size interval (NF) less the thickness of the fin structures, and the second row and an adjacent third row has a center-to-center spacing of the minimum feature size interval (NF) plus the thickness of the fin structures.

* * * * *